(12) United States Patent
Takenaka et al.

(10) Patent No.: US 9,117,658 B2
(45) Date of Patent: Aug. 25, 2015

(54) METHOD OF PRODUCING SEMICONDUCTOR WAFER, SEMICONDUCTOR WAFER, METHOD OF PRODUCING SEMICONDUCTOR DEVICE AND SEMICONDUCTOR DEVICE

(71) Applicants: SUMITOMO CHEMICAL COMPANY, LIMITED, Chuo-ku, Tokyo (JP); THE UNIVERSITY OF TOKYO, Bunkyo-ku, Tokyo (JP)

(72) Inventors: Mitsuru Takenaka, Bunkyo-ku (JP); Shinichi Takagi, Bunkyo-ku (JP); Jaehoon Han, Bunkyo-ku (JP); Tomoyuki Takada, Tsukuba (JP); Takenori Osada, Tsukuba (JP); Masahiko Hata, Tsukuba (JP)

(73) Assignees: SUMITOMO CHEMICAL COMPANY, LIMITED, Tokyo (JP); THE UNIVERSITY OF TOKYO, Tokyo (JP)

(*) Notice: Subject to any disclaimer, the term of this patent is extended or adjusted under 35 U.S.C. 154(b) by 13 days.

(21) Appl. No.: 13/974,962

(22) Filed: Aug. 23, 2013

(65) Prior Publication Data

US 2014/0054726 A1 Feb. 27, 2014

(30) Foreign Application Priority Data

Aug. 24, 2012 (JP) ................................ 2012-184908

(51) Int. Cl.
*H01L 29/51* (2006.01)
*H01L 21/02* (2006.01)
(Continued)

(52) U.S. Cl.
CPC .... *H01L 21/02123* (2013.01); *H01L 21/28176* (2013.01); *H01L 21/28202* (2013.01);
(Continued)

(58) Field of Classification Search
CPC .............. H01L 21/02123; H01L 21/3105; H01L 21/02178; H01L 21/0228; H01L 21/02329; H01L 21/0234; H01L 23/58; H01L 29/51; H01L 29/401; H01L 21/28176; H01L 21/28202; H01L 29/518
See application file for complete search history.

(56) References Cited

U.S. PATENT DOCUMENTS

2007/0111521 A1* 5/2007 Wilk .............................. 438/680

OTHER PUBLICATIONS

Jaehoon Han et al., "Reduction in Interface Trap Density of $Al_2O_3$/SiGe Gate Stack by Electron Cyclotron Resonance Plasma Post-nitridation", Applied Physics Express, vol. 6, 2013, pp. 051302-1-051302-4.

(Continued)

*Primary Examiner* — Victor A Mandala
*Assistant Examiner* — Quovaunda V Jefferson
(74) *Attorney, Agent, or Firm* — Sughrue Mion, PLLC

(57) ABSTRACT

There is provided a fabrication technique of a MOS structure that has a small EOT without increasing the interface trap density. More specifically, provided is a method of producing a semiconductor wafer that includes a semiconductor crystal layer, an interlayer made of an oxide, nitride, or oxynitride of a semiconductor crystal constituting the semiconductor crystal layer, and a first insulating layer made of an oxide and in which the semiconductor crystal layer, the interlayer, and the first insulating layer are arranged in the stated order. The method includes (a) forming the first insulating layer on an original semiconductor crystal layer, and (b) exposing a surface of the first insulating layer with a nitrogen plasma to nitride, oxidize, or oxynitride a part of the original semiconductor crystal layer, thereby forming the interlayer, together with the semiconductor crystal layer that is the rest of the original semiconductor crystal layer.

3 Claims, 47 Drawing Sheets

(51) Int. Cl.
  *H01L 23/58* (2006.01)
  *H01L 29/40* (2006.01)
  *H01L 21/3105* (2006.01)
  *H01L 21/28* (2006.01)

(52) U.S. Cl.
  CPC ............ *H01L21/3105* (2013.01); *H01L 23/58* (2013.01); *H01L 29/401* (2013.01); *H01L 29/51* (2013.01); *H01L 29/518* (2013.01); *H01L 21/0228* (2013.01); *H01L 21/0234* (2013.01); *H01L 21/02178* (2013.01); *H01L 21/02329* (2013.01); *H01L 2924/0002* (2013.01)

(56) References Cited

OTHER PUBLICATIONS

INFOS 2013, 18th Conference of "Insulating Films on Semiconductors", Jun. 25-28, 2013, Cracow, Poland, Final Program.

Paper presented at INFOS 2013, 18th Conference of "Insulating Films on Semiconductors" on Jun. 27, 2013 by J.-H. Han et al., "Impact of plasma post-nitridation on $HfO_2/Al_2O_3$/SiGe gate stacks toward EOT scaling", 3 pgs.

J.-H. Han et al., "Impact of plasma post-nitridation on $HfO_2/Al_2O_3$/SiGe gate stacks toward EOT scaling", Microelectronic Engineering, vol. 109, 2013, pp. 266-269.

C. Le Royer et al., "First Demonstration of Ultrathin Body c-SiGe Channel FDSOI pMOSFETs combined with *SiGe(:B)* RSD: Drastic Improvement of Electrostatics ($V_{th,p}$ tuning, DIBL) and Transport ($\mu_0$, $I_{sat}$) Properties down to 23nm Gate Length", IEDM, 16.5.1, 2011, pp. 394-397.

S.S. Iyer et al., "A Gate-Quality Dielectric System for SiGe Metal-Oxide-Semiconductor Devices", IEEE Electron Device Letters, vol. 12, No. 5, May 1991, pp. 246-248.

Jidong Huang et al., "A Study of compressively strained Si0.5Ge0.5 metal-oxide-semiconductor capacitors with chemical vapor deposition HfAlO as gate dielectric", App. Phys. Lett., vol. 90, 023502, 2007.

R. Hull et al., "In situ observations of misfit dislocation propagation in $Ge_xSi_{1-x}$/Si(100) heterostructures", Appl. Phys. Lett., vol. 52, 1988, pp. 1605-1607.

* cited by examiner

METHOD OF PRODUCING SEMICONDUCTOR WAFER, SEMICONDUCTOR WAFER, METHOD OF PRODUCING SEMICONDUCTOR DEVICE AND SEMICONDUCTOR DEVICE

The contents of the following Japanese patent application is incorporated herein by reference:
JP2012-184908 filed on Aug. 24, 2012.

TECHNICAL FIELD

The present invention relates to a method of producing a semiconductor wafer, a semiconductor wafer, a method of producing a semiconductor device and a semiconductor device.

BACKGROUND ART

Silicon germanium (SiGe) is desirable for a p-type channel material of a Metal-Oxide-Semiconductor Field-Effect Transistor (MOSFET) since it has a higher hole mobility than that of silicon (Si). For instance, Non-patent Document 1 describes a p-channel MOSFET (pMOSFET) in which SiGe is used for a channel material. In the pMOSFET, in order to reduce a level density of carrier trap (hereunder referred to as "an interface trap density") at an interface between semiconductor and an oxide layer in a MOS structure (hereunder referred to as "a MOS interface"), used is a Si passivation technique in which a surface of SiGe is covered with a Si layer and then an oxide layer is formed.

Non-patent Document 2 indicates that Si is selectively oxidized at a MOS interface in which SiGe is used as semiconductor and consequently Ge is piled up, resulting in increase in the interface trap density. Non-patent Document 3 describes results in which an oxide layer with a high dielectric-constant (a HfAlO layer) is formed on a SiGe surface on which nitridation with ammonia ($NH_3$) has been performed, and then interface characteristics and electric properties are evaluated. Non-patent Document 4 describes that misfit dislocation in a SiGe layer that is formed on a Si wafer increases as a temperature of thermal treatment increases.

The above mentioned Non-patent Document 1 is C. Le Royer et al., "First demonstration of ultrathin body c-SiGe channel FDSOI pMOSFETs combined with SiGe(:B) RSD: Drastic improvement of electrostatics (Vth,p tuning, DIBL) and transport (μ0, Isat) properties down to 23 nm gate length", IEDM, 16.5.1(2011), Non-patent Document 2 is S. S. Iyer et al., "A gate-quality dielectric system for SiGe metal-oxide-semiconductor devices", EDL, 12, 246(1991), Non-patent Document 3 is J. Huang et al., "A Study of compressively strained Si0.5Ge0.5 metal-oxide-semiconductor capacitors with chemical vapor deposition HfAlO as gate dielectric", APL, 90, 023502(2007), and Non-patent Document 4 is R. Hull et al., "In situ observations of misfit dislocation propagation in GexSi1-x/Si(100) heterostructures", APL, 52, 1605 (1988).

SUMMARY OF THE INVENTION

Problem to be Solved by the Invention

It is possible to reduce the interface trap density through the Si passivation described in Non-patent Document 1. However, in the case where the Si passivation layer is present, the Si passivation layer is oxidized while an oxide layer is formed on a semiconductor, and consequently an equivalent oxide thickness (EOT) of an insulating layer (an oxidized layer) is increased, and this is undesirable for scaling of MOSFET elements. Whereas in the case where an oxide layer is formed directly on the SiGe semiconductor layer without forming the Si passivation layer, Ge is piled up and the interface trap density consequently increases as described in Non-patent Document 2.

Nitridation as described in Non-patent Document 3 can be considered to be performed onto a surface of the SiGe semiconductor layer, which is however undesirable because it is difficult to control the thickness of the nitrided layer and there is a possibility of misfit dislocation in the SiGe layer due to a thermal treatment for nitridation as described in Non-patent document 4.

It is an object of the present invention to provide a fabrication technique of a MOS structure that has a small EOT without increasing the interface trap density.

Means for Solving Problem

For a solution to the above-mentioned problems, according to the first aspect related to the present invention, provided is one exemplary method of producing a semiconductor wafer that includes a semiconductor crystal layer, an interlayer made of an oxide, nitride, or oxynitride of a semiconductor crystal constituting the semiconductor crystal layer, and a first insulating layer made of an oxide and in which the semiconductor crystal layer, the interlayer, and the first insulating layer are arranged in the stated order. The method includes (a) forming the first insulating layer on an original semiconductor crystal layer, and (b) exposing a surface of the first insulating layer with a nitrogen plasma to nitride, oxidize, or oxynitride a part of the original semiconductor crystal layer, thereby forming the interlayer, together with the semiconductor crystal layer that is the rest of the original semiconductor crystal layer.

The method may further include subsequent to (b) above, forming a second insulating layer on the first insulating layer. The method may further include prior to (a) above, removing a natural oxide layer from a surface of the original semiconductor crystal layer. In the method, the nitrogen plasma may be generated using Electron Cyclotron Resonance (ECR). In the method, the first insulating layer may be an $Al_2O_3$ layer formed by an atomic layer deposition (ALD) method. The first insulating layer and the second insulating layer may be $Al_2O_3$ layers formed by an ALD method. The semiconductor crystal layer may be made of Si, Ge, or SiGe. When the semiconductor crystal layer is made of $Si_{1-x}Ge_x$, x satisfies preferably $0.13 \leq x \leq 0.40$, and more preferably $0.13 \leq x \leq 0.25$. When the first insulating layer and the second insulating layer are $Al_2O_3$ layers formed by an ALD method, the thickness of the first insulating layer is preferably 0.2 to 2.0 nm, and more preferably 0.5 to 2.0 nm.

According to the second aspect related to the invention, provided is a semiconductor wafer that includes a semiconductor crystal layer, an interlayer, and an insulating layer made of an oxide. The semiconductor crystal layer, the interlayer, and the insulating layer are arranged in the stated order, the interlayer is made of an oxide, nitride, or oxynitride of a semiconductor crystal constituting the semiconductor crystal layer, the semiconductor crystal layer is made of $Si_{1-x}Ge_x$ ($x \leq 0.40$), a part of the insulting layer in contact with the interlayer is made of $Al_2O_3$, and an interface trap density measured by a conductance method where the semiconductor crystal layer and the insulating layer form a semiconductor-insulator interface in a MOS structure is $1 \times 10^{12}$ [$eV^{-1}cm^{-2}$] or less. In the semiconductor wafer, an increase from an equivalent oxide thickness (EOT) where the surface is not exposed to plasma before the insulating layer is formed or after at least a part of the insulting layer is formed to an EOT where the semiconductor crystal layer and the insulating layer form a semiconductor-insulator interface in the MOS structure may be 0.5 nm or less.

According to the third aspect related to the invention, provided is a method of producing a semiconductor device. The method includes the above-described method of producing a semiconductor wafer, and further includes forming an electrically-conductive layer on an insulating layer that includes the first insulating layer. In the method, a MOS structure of the semiconductor device is formed of the semiconductor crystal layer, the insulating layer, and the electrically-conductive layer. According to the fourth aspect related to the invention, provided is a semiconductor device that includes the above-described semiconductor wafer, and an electrically conductive layer formed on the insulating layer. In the semiconductor device, a MOS structure is formed of the semiconductor crystal layer, the insulating layer, and the electrically-conductive layer.

MODE FOR CARRYING OUT THE INVENTION

Figure 1:
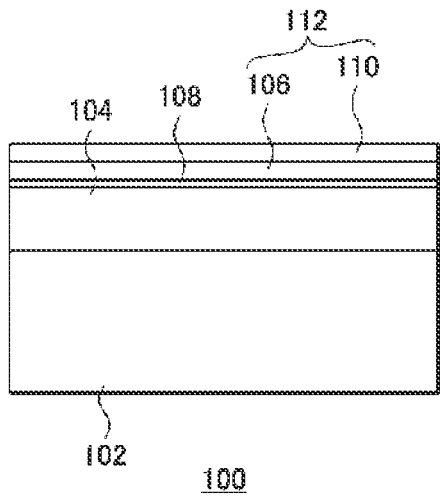
FIG. 1 is a sectional view of a semiconductor wafer 100.

FIG. 1 is a sectional view of a semiconductor wafer 100. The semiconductor wafer 100 includes a semiconductor crystal layer 104, an interlayer 108, and an insulating layer 112 on a supporting wafer 102. The semiconductor crystal layer 104, the interlayer 108, and the insulating layer 112 are arranged in the stated order.

The supporting wafer 102 is a wafer to support the semiconductor crystal layer 104. The supporting wafer 102 can be formed of any material provided that it has a sufficient mechanical strength to support the semiconductor crystal layer 104. The supporting wafer 102 can be an epitaxial growth wafer for forming the semiconductor crystal layer 104 by epitaxial growth. The supporting wafer 102 can be a transfer-destination wafer on which the semiconductor crystal layer 104 is formed by a transfer method. An example of the supporting wafer 102 includes a silicon wafer, a germanium wafer, a silicon carbide wafer, an alumina wafer, a sapphire wafer, a glass wafer, or the like.

The semiconductor crystal layer 104 serves as an activation layer for a semiconductor device such as a pMOSFET. The semiconductor crystal layer 104 can be made of a semiconductor crystal such as Si, Ge or SiGe. As described later herein, the semiconductor crystal layer 104 on which an insulating layer has been formed is exposed with a nitrogen plasma to form the interlayer 108. When the interlayer 108 is formed in such a way, it is possible to reduce the interface trap density of the MOS structure. Moreover, it is also possible to prevent the EOT from increasing. It has been confirmed that the interface trap density can be reduced when the semiconductor crystal layer 104 is made of $Si_{1-x}Ge_x$ and x satisfies $0.13 \leq x \leq 0.40$ (preferably $0.13 \leq x \leq 0.25$). The semiconductor crystal layer 104 may be formed on a semiconductor crystal formation wafer by an epitaxial growth method or transfer method.

The interlayer 108 is made of an oxide, nitride or oxynitride of a semiconductor crystal constituting the semiconductor crystal layer 104. A method of manufacturing the interlayer 108 will be described later. Examples of the interlayer 108 include an oxynitride of silicon (Si—ON), a nitride of silicon (Si—N), an oxide of silicon (Si—O), an oxynitride of germanium (Ge—ON), a nitride of germanium (Ge—N), an oxide of germanium (Ge—O), an oxynitride of silicon germanium (SiGe—ON), a nitride of silicon germanium (SiGe—ON), and an oxide of silicon germanium (SiGe—O).

The insulating layer 112 is made of an oxide and includes a first insulating layer 106 and a second insulating layer 110. The first insulating layer 106 and the second insulating layer 110 can be made of the same material or different materials. Examples of the first insulating layer 106 and the second insulating layer 110 include $Al_2O_3$ layer, $GeO_x$ layer, $InO_x$ layer, $TiO_x$ layer, $ZrO_x$ layer, $HfO_x$ layer, and $TaO_x$ layer. The thickness of the first insulating layer 106 is preferably set such that active nitrogen atoms (or molecules) supplied from the nitrogen plasma can transmit through the first insulating layer 106. Alternatively, the thickness of the first insulating layer 106 is preferably set such that energy of the nitrogen plasma can be transmitted to the interface and oxygen inside the first insulating layer 106 can be activated.

The insulating layer 112 that includes the first insulating layer 106 and the second insulating layer 110 serves as a gate insulating layer for the pMOSFET. Thus, the thickness of the second insulating layer 110 is preferably set such that it can serve as a gate insulating layer. When the first insulating layer 106 alone serves as the gate insulating layer, it is not necessary to provide the second insulating layer 110.

An example of the first insulating layer 106 includes $Al_2O_3$ layer formed by an ALD method. An example of the first insulating layer 106 and the second insulating layer 110 includes $Al_2O_3$ layers formed by the ALD method. When the first insulating layer 106 and the second insulating layer 110 are $Al_2O_3$ layers formed by the ALD method, the thickness of the first insulating layer 106 is preferably 0.2 nm to 2.0 nm, and more preferably 0.5 nm to 2.0 nm.

According to the above-described semiconductor wafer 100, it is possible to reduce the interface trap density of the MOS structure and to reduce the EOT. When the semiconductor crystal layer 104 is made of $Si_{1-x}Ge_x$ (x satisfies $x \leq 0.40$, preferably $x \leq 0.25$, and more preferably $x < 0.25$) and a part of the insulating layer 112 in contact with the interlayer 108 is made of $Al_2O_3$, the interface trap density measured by a conductance method where the semiconductor crystal layer 104 and the insulating layer 112 form a semiconductor-insulator interface in the MOS structure can be made to $1 \times 10^{12}$ $[eV^{-1}cm^{-2}]$ or less. Moreover, in this case, an increase from the EOT where the nitrogen plasma exposure is not performed to the EOT where the semiconductor crystal layer 104 and the insulating layer 112 form the semiconductor-insulator interface in the MOS structure can be made to 0.5 nm or less. While the case in which the exposure to the nitrogen plasma is not performed is considered to be most effective to reduce the EOT since the interlayer 108 is not formed (whereas the interface trap density cannot be reduced), the increase of the EOT, in the embodiment of the semiconductor wafer 100, can be still made small since the nitrogen plasma exposure is performed after the first insulating layer 106 is formed, so it is possible to reduce the interface trap density and to make the increase of the EOT small.

Figure 2:
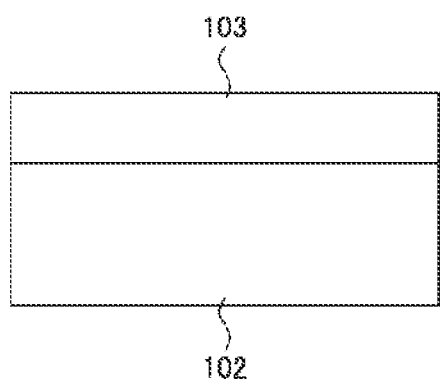
FIG. 2 is a sectional view illustrating a step of a method of producing the semiconductor wafer 100.
Figure 3:
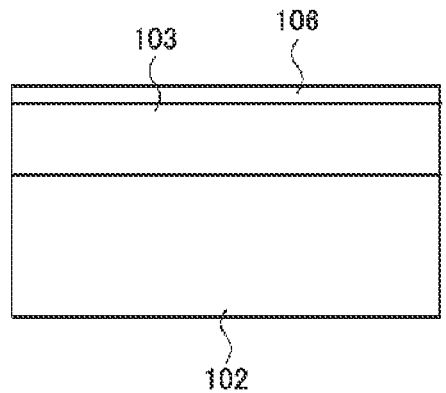
FIG. 3 is a sectional view illustrating a step of the method of producing the semiconductor wafer 100.
Figure 4:
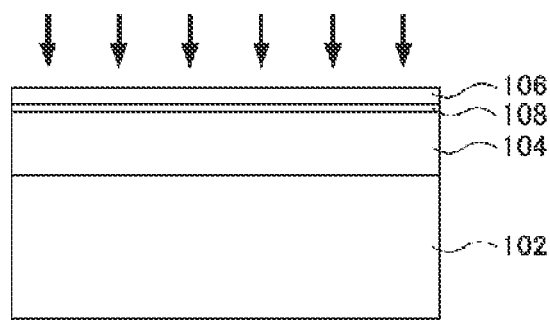
FIG. 4 is a sectional view illustrating a step of the method of producing the semiconductor wafer 100.

FIGS. 2 to 4 are sectional views illustrating steps of the method of producing the semiconductor wafer 100. Referring to FIG. 2, an original semiconductor crystal layer 103 is formed on the supporting wafer 102. Using the supporting wafer 102 as a wafer for epitaxial growth, the original semiconductor crystal layer 103 may be formed on the wafer by an epitaxial growth method. Alternatively, after the original semiconductor crystal layer 103 is formed on a wafer for epitaxial growth, the original semiconductor crystal layer 103 may be transferred on the supporting wafer 102.

Referring to FIG. 3, the first insulating layer 106 is formed on the original semiconductor crystal layer 103. The first insulating layer 106 can be formed by, for example, an ALD method.

Referring to FIG. 4, the surface of the first insulating layer 106 is exposed to the nitrogen plasma (indicated by the arrow in the drawing), whereby a part of the original semiconductor crystal layer 103 is nitrided, oxidized or oxynitrided to form the interlayer 108. The rest of the original semiconductor crystal layer 103 becomes the semiconductor crystal layer 104. Here, nitridation, oxidation or oxynitridation of a part of the original semiconductor crystal layer 103 includes nitridation, oxidation or oxynitridation of a portion of the original semiconductor crystal layer 103 near the interface between the original semiconductor crystal layer 103 and the first insulating layer 106.

Such process of forming the interlayer 108 by the nitrogen plasma exposure after the first insulating layer 106 is formed is hereunder referred to as a "post-nitridation" in the description. In addition, exposure to the nitrogen plasma before the first insulating layer 106 is formed is hereunder referred to as a "pre-nitridation", exposure to an oxygen plasma after the first insulating layer 106 is formed is hereunder referred to as a "post-oxidation," exposure to the oxygen plasma before the first insulating layer 106 is formed is hereunder referred to as a "pre-oxidation," and the case in which the plasma treatment is not performed is referred to as "no-treatment", which will be later described for comparison.

Figure 5:
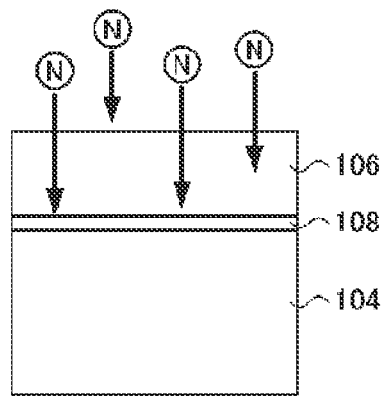
FIG. 5 is a sectional view illustrating a concept of post-nitridation.

FIG. 5 is a sectional view illustrating a concept of the post-nitridation. It is assumed that high-energy nitrogen radicals (ions, excited-state molecules, excited-state atoms or the like) pass through the first insulating layer 106 and reach the original semiconductor crystal layer 103 to react with silicon, germanium, or silicon germanium in the original semiconductor crystal layer 103 and consequently the interlayer 108 is formed. There is also an assumption that oxygen atoms in the first insulating layer 106 are activated with the nitrogen radicals to generate active oxygen atoms, and then the active oxygen atoms react, at the interface between the first insulating layer 106 and the original semiconductor crystal layer 103, with silicon, germanium, or silicon germanium in the original semiconductor crystal layer 103 and consequently the interlayer 108 is formed.

After the interlayer 108 is formed, the second insulating layer 110 is formed on the first insulating layer 106 to obtain the semiconductor wafer 100. Here, a natural oxide may be removed from a surface of the original semiconductor crystal layer 103 after the original semiconductor crystal layer 103 is formed and before the first insulating layer 106 is formed. Removing the natural oxide film can decrease the EOT and reduce the interface trap density. A nitrogen plasma generated by Electron Cyclotron Resonance (ECR) can be used as the nitrogen plasma. The ECR can generate a high-density plasma, so it is possible to increase the density of active nitrogen.

Figure 6:
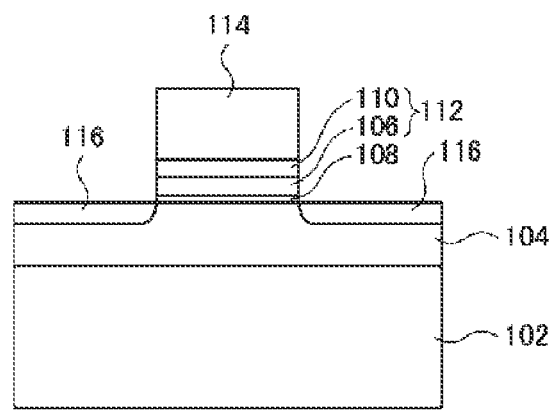
FIG. 6 is a sectional view of a semiconductor device 200.
Figure 7:
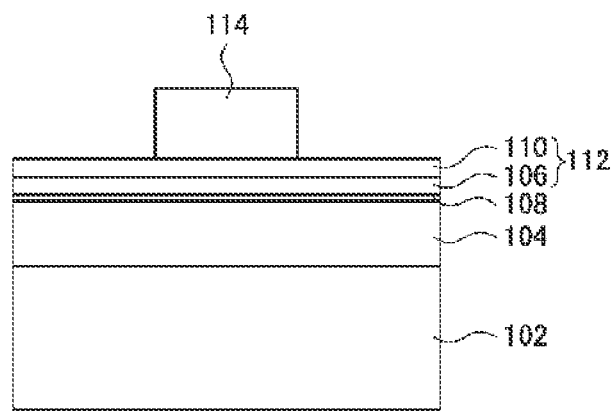
FIG. 7 is a sectional view illustrating a production process of the semiconductor device 200.

FIG. 6 is a sectional view of a semiconductor device 200. FIG. 7 is a sectional view illustrating a production process of the semiconductor device 200. The semiconductor device 200 can be produced using the above-described semiconductor wafer 100.

Referring to FIG. 7, an electrically-conductive layer 114 is formed on the insulating layer 112. In this way, a MOS structure including the semiconductor crystal layer 104, the insulating layer 112, and the electrically-conductive layer 114 is formed. The semiconductor device 200 illustrated in FIG. 6 is one in which the electrically-conductive layer 114 is used as a gate electrode, and the insulating layer 112 and the interlayer 108 are used as a gate insulating layer, and source-drains 116 are formed on the semiconductor crystal layer 104 to form a MOSFET.

Because the interlayer 108 is formed through the above-described method, or post-nitridation, in the semiconductor device 200, it is possible to realize a high-performance pMOSFET that has a small EOT and a small interface trap density.

EXAMPLE 1

A p-type Si wafer was used as the supporting wafer 102, and $Si_{0.75}Ge_{0.25}$ having a thickness of 30 nm was formed as the original semiconductor crystal layer 103 by a Chemical Vapor Deposition (CVD) method. After the surface of the original semiconductor crystal layer 103 was cleaned, the first $Al_2O_3$ layer having a thickness of 1 nm was formed as the first insulating layer 106 by the ALD method at a temperature of 250° C. Subsequently, the surface of the first $Al_2O_3$ layer was exposed to an $N_2$ ECR plasma with a power of 650 W for 10 seconds. The second $Al_2O_3$ layer was formed as the second insulating layer 110 by the ALD method, and then a post-deposition annealing (PDA) was performed under nitrogen atmosphere at a temperature of 400° C. for one minute. In this manner, the semiconductor wafer described in the example was fabricated. In order to evaluate the fabricated semiconductor wafer, an Al layer (an electrically-conductive layer) was formed on the front and back sides of the semiconductor wafer by deposition to form a MOS structure, and then a post-metallization anneal was performed to the MOS structure under nitrogen atmosphere at a temperature of 400° C. for one minute. The treatment in the example is referred to as a "post-nitridation."

For comparison, provided were a sample on which a post-oxidation treatment in which the first $Al_2O_3$ layer was exposed to an $O_2$ ECR plasma instead of the $N_2$ ECR plasma was performed, a sample on which a pre-nitridation treatment in which the exposure to the $N_2$ ECR plasma was performed before the first $Al_2O_3$ layer was formed was performed, a sample on which a pre-oxidation treatment in which the exposure to the $O_2$ ECR plasma was performed before the first $Al_2O_3$ layer was formed was performed, and a sample on which no plasma treatment was performed, in another word, no-treatment was performed.

Figure 8:
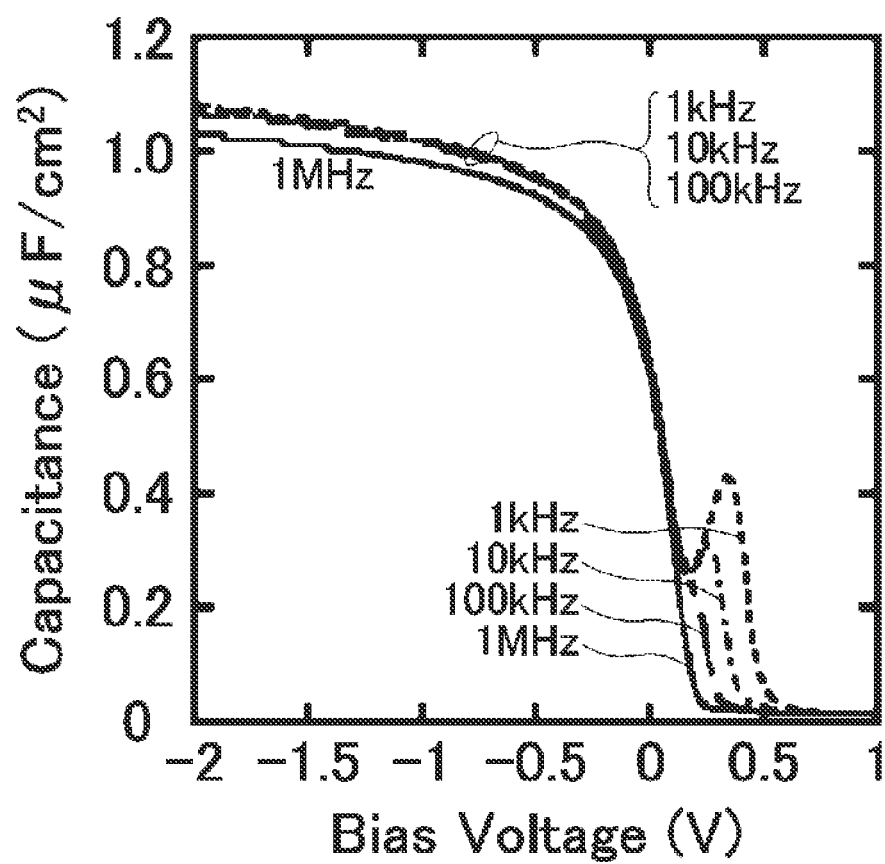
FIG. 8 is a graph of CV characteristics of a MOS structure without nitridation or oxidation.
Figure 9:
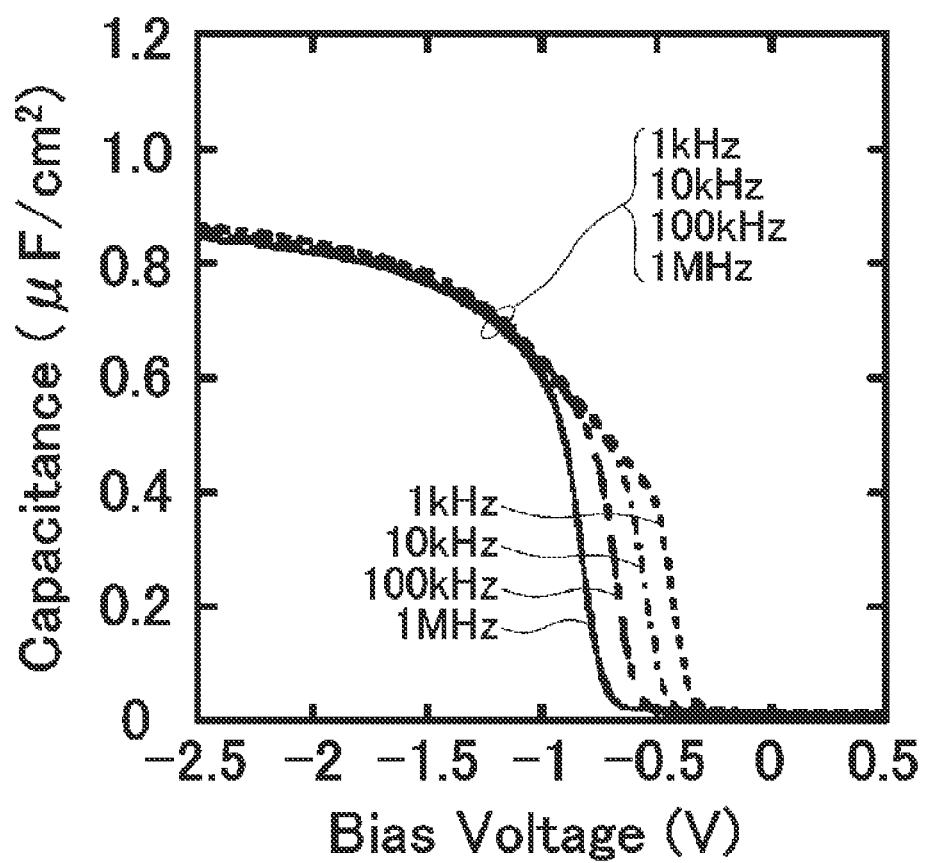
FIG. 9 is a graph of CV characteristics of a MOS structure on which pre-nitridation is performed.
Figure 10:
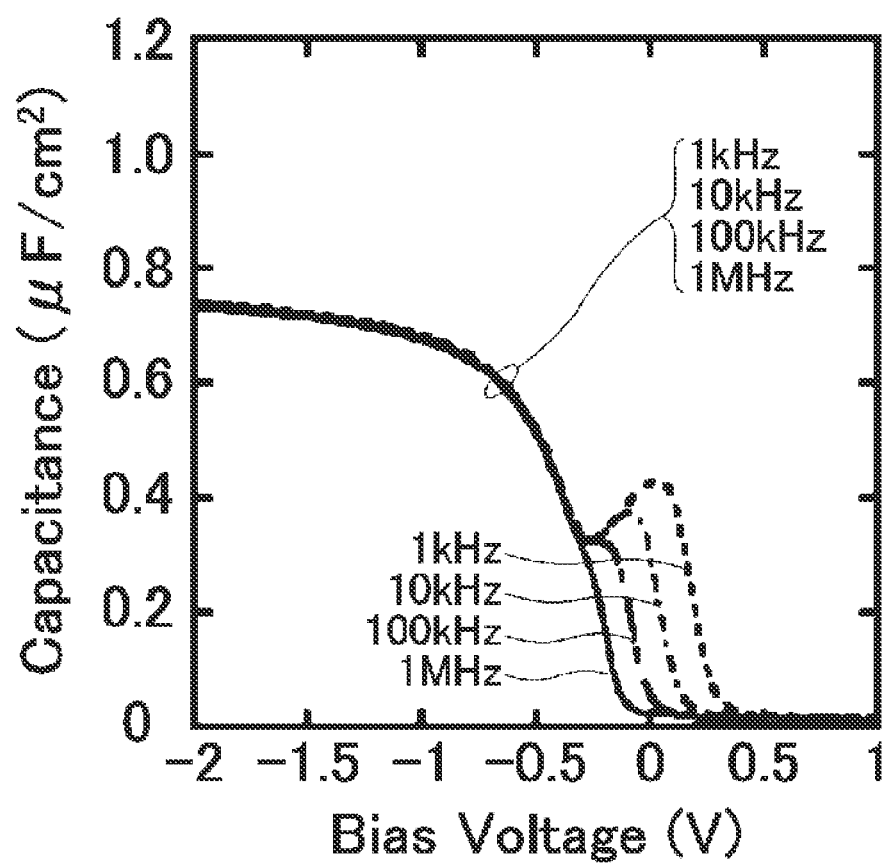
FIG. 10 is a graph of CV characteristics of a MOS structure on which a pre-oxidation is performed.
Figure 11:
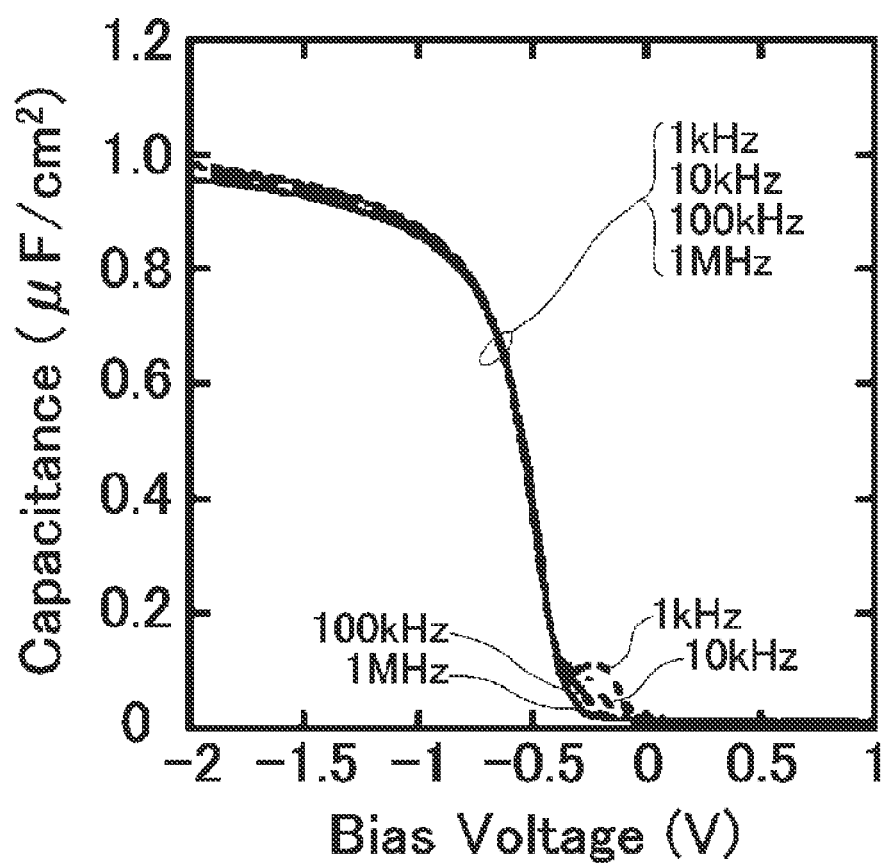
FIG. 11 is a graph of CV characteristics of a MOS structure on which post-nitridation is performed.
Figure 12:
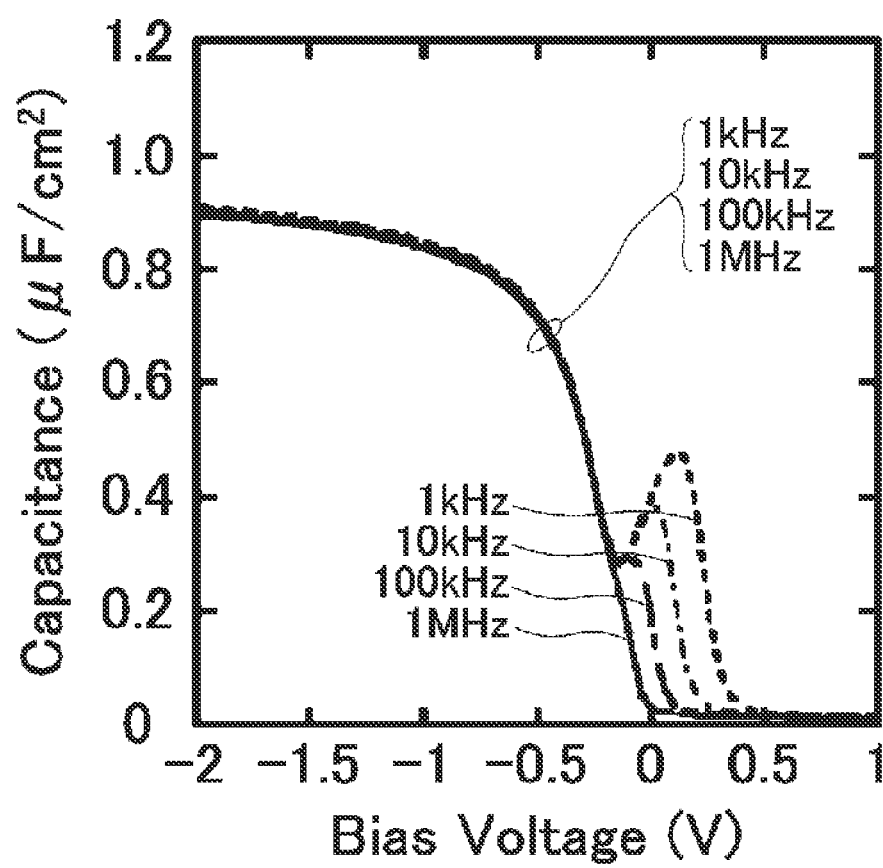
FIG. 12 is a graph of CV characteristics of a MOS structure on which post-oxidation is performed.

FIGS. 8 to 12 are graphs of CV characteristics of the MOS structures (a structure in which a supporting wafer, a semiconductor crystal layer, an interlayer, an insulating layer and an electrically-conductive layer have been stacked in the stated order) fabricated in the above described way. FIG. 8 shows the non-treatment sample, FIG. 9 shows the pre-nitridation sample, FIG. 10 shows the pre-oxidation sample, FIG. 11 shows the post-nitridation sample (the semiconductor wafer of the example), and FIG. 12 shows the post-oxidation sample. It can be seen from FIG. 8 to FIG. 12, a lump in the CV curve is smallest in the post-nitridation sample shown in FIG. 11. This indicates that the interface trap density is smallest when the post-nitridation is performed. The EOT increased in the order from the non-treatment, the post-nitridation, the post-oxidation, the pre-nitridation, and the pre-oxidation, and a value of the EOT was 3.1, 3.3, 3.5, 3.8, and 4.4 (nm) respectively. When the post-nitridation treatment was performed, the interface trap density was lowest, and an increase of the EOT as compared to when no treatment was performed was only 0.2 nm. Thus, it is understood that the post-nitridation treatment can realize the decrease of the interface trap density by one order of magnitude or more as compared to the non-treatment or other plasma treatments, and can suppress the increase of the EOT to the extent that is little different from that of the non-treatment.

Figure 13:
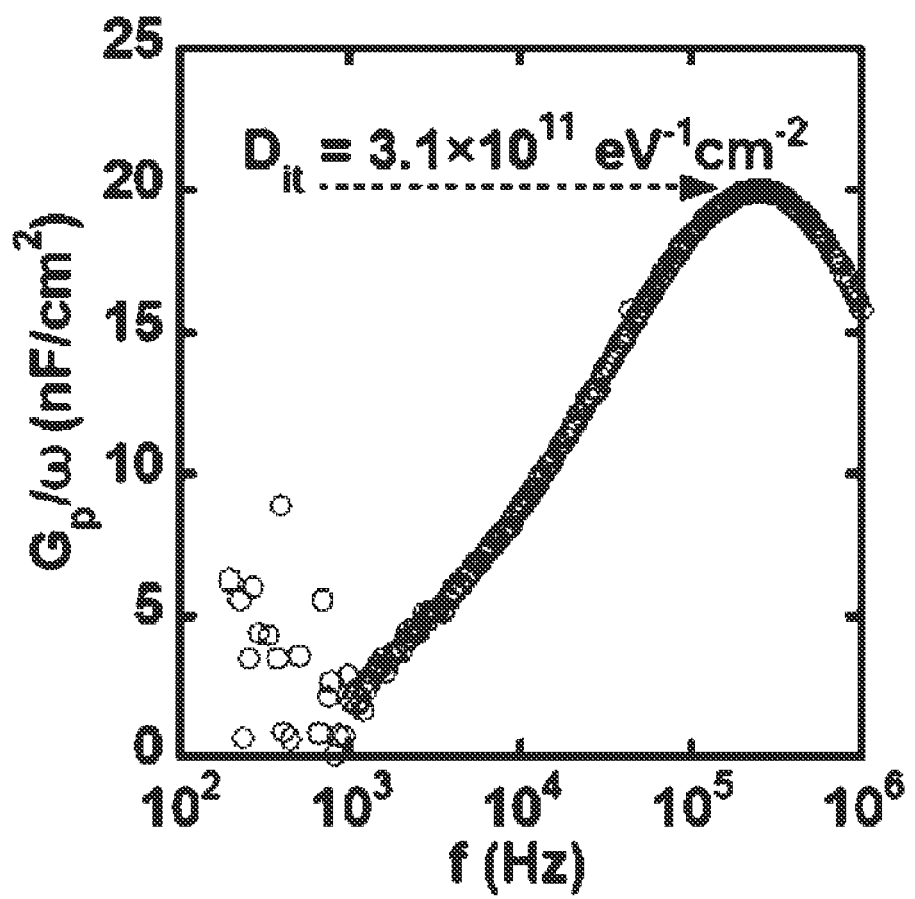
FIG. 13 is a graph of a conductance curve of a MOS structure on which the post-nitridation is performed.
Figure 14:
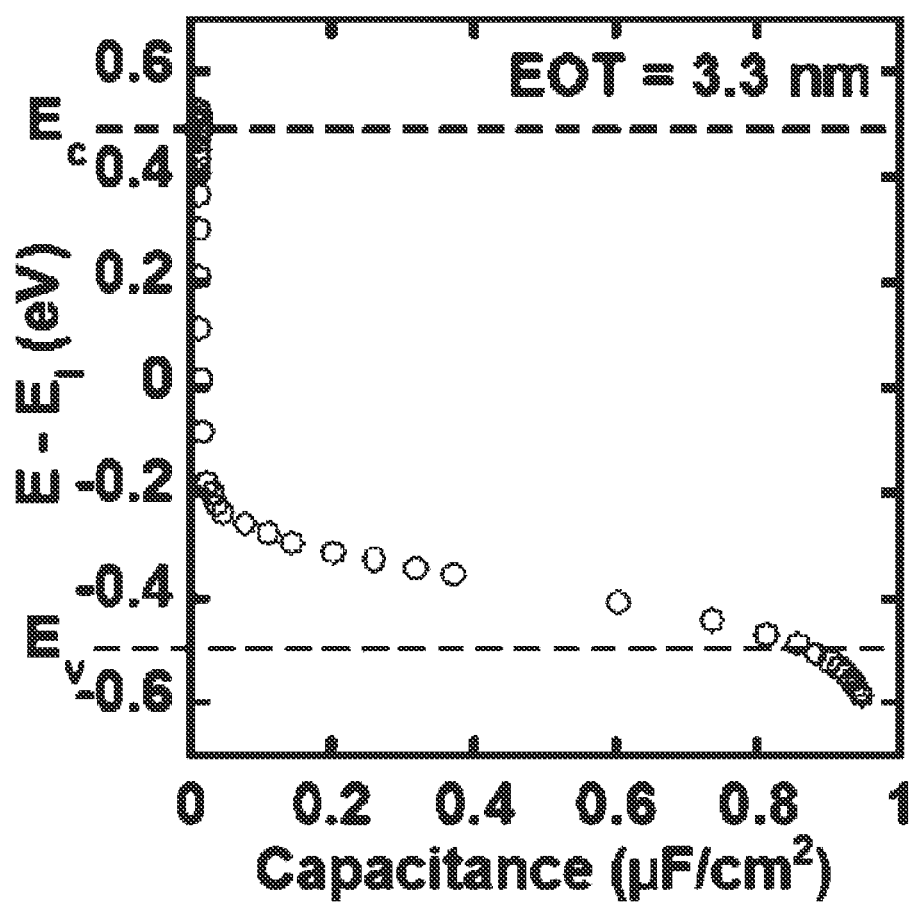
FIG. 14 is a graph illustrating a relation between a capacitance and a band bending of the MOS structure on which the post-nitridation is performed.

FIG. 13 is a graph showing a conductance curve of a MOS structure on which the post-nitridation was performed. FIG. 14 is a graph illustrating a relation between a capacitance and a band bending of the MOS structure on which the post-nitridation was performed. From the results shown in FIGS. 13 and 14, the interface trap density along the energy axis can be estimated, and in this example (in the case of a semiconductor wafer on which the post-nitridation was performed), an interface trap density $D_{it}$ was $3.1 \times 10^{11}$ [eV$^{-1}$cm$^{-2}$] when a bias voltage $V_g$=−0.32V (E−$E_i$=−0.24 eV).

Figure 15:
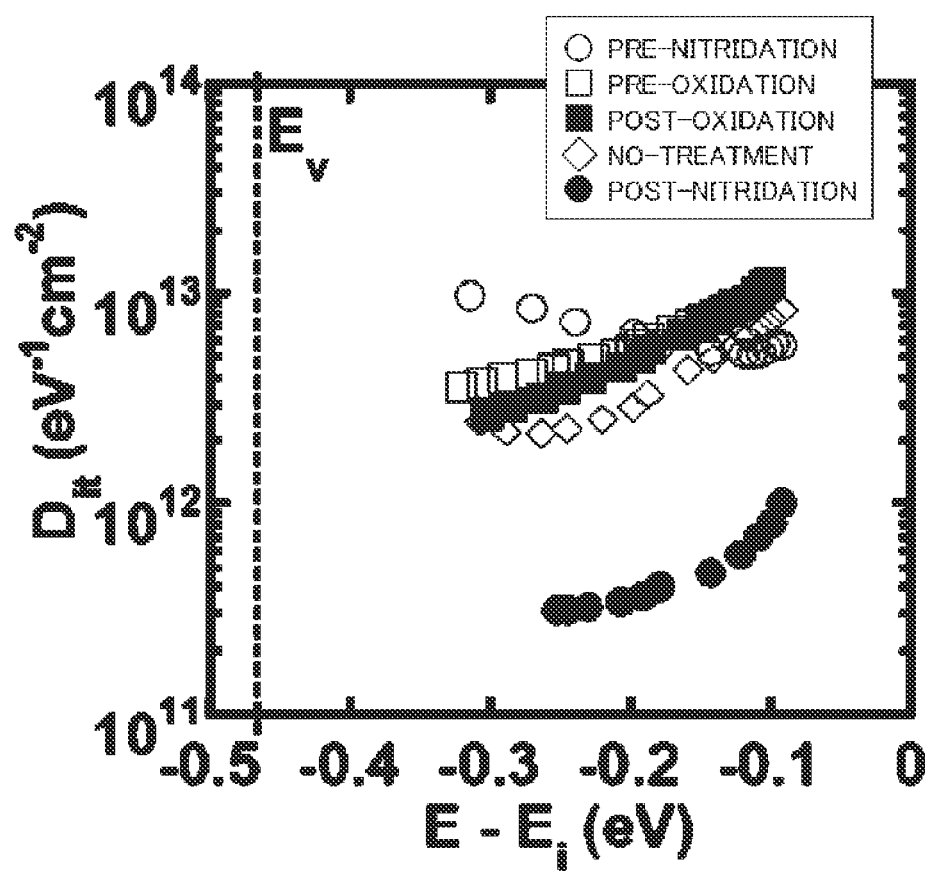
FIG. 15 is a graph showing distributions of the interface trap density along energy axes in each treatment sample.

FIG. 15 is a graph showing distributions of the interface trap density along energy axes in each treatment. The post-nitridation sample showed that the interface trap density of $D_{it}$ was decreased by one order of magnitude or more on each energy axis than those of other treatment samples.

Figure 16:
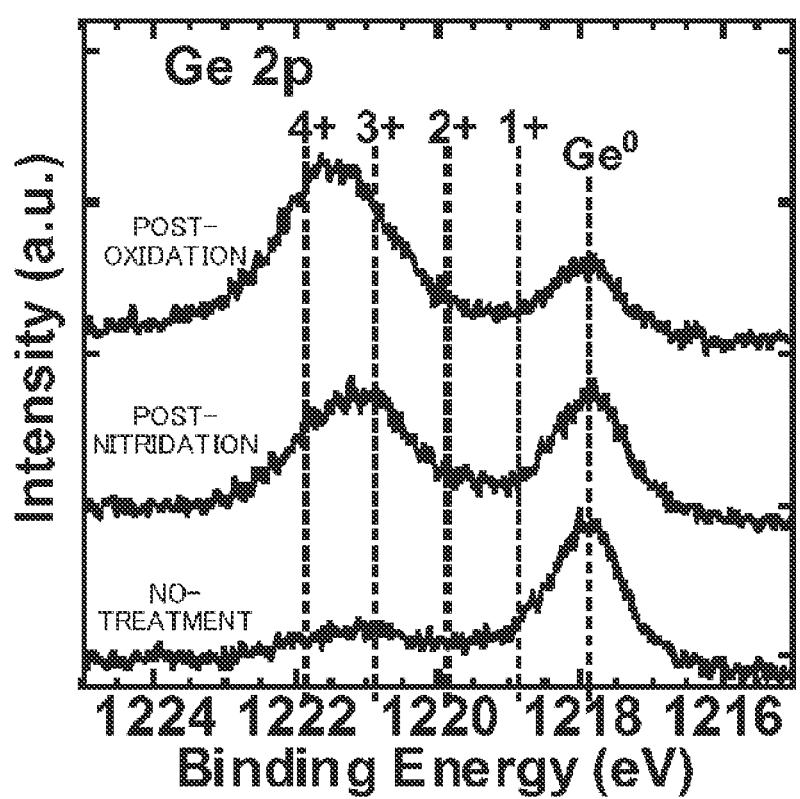
FIG. 16 is a graph showing enlarged views of Ge 2p portion of XPS measurement results for an interface between an $Si_{0.75}Ge_{0.25}$ layer and a first $Al_2O_3$ layer at each treatment.
Figure 17A:
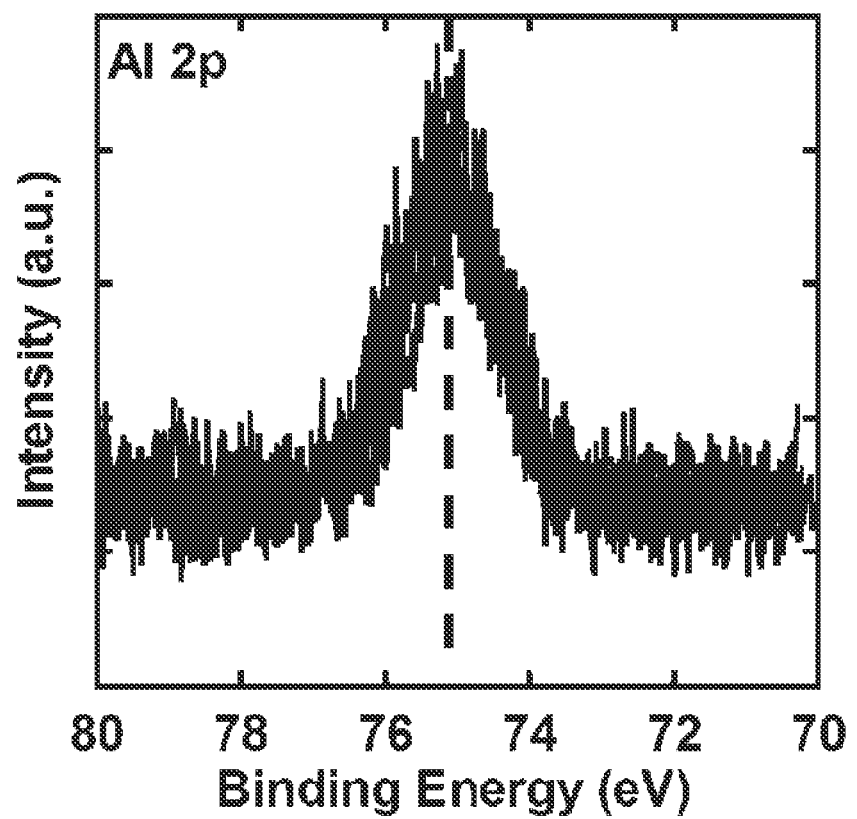
FIG. 17A is a graph showing a superposition of enlarged views of Al 2p portion of the XPS measurement results for the interface between the $Si_{0.75}Ge_{0.25}$ layer and the first $Al_2O_3$ layer at each treatment.
Figure 17B:
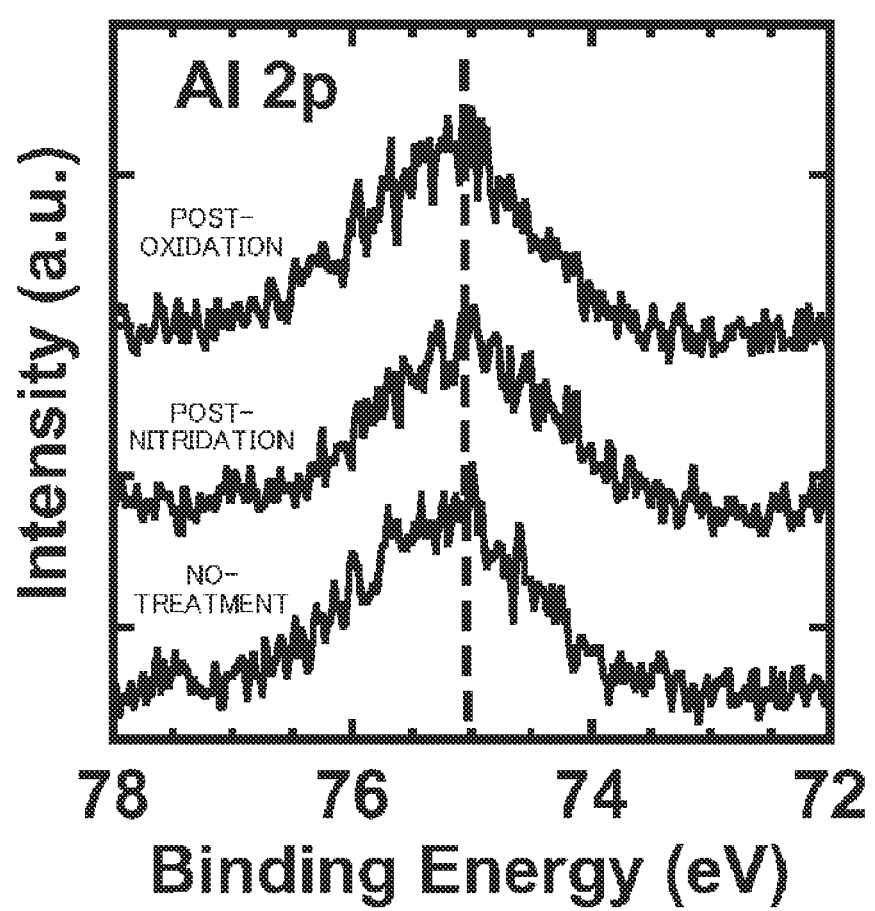
FIG. 17B is a graph showing enlarged views of Al 2p portion of the XPS measurement results for the interface between the $Si_{0.75}Ge_{0.25}$ layer and the first $Al_2O_3$ layer at each treatment.

FIG. 16 is a graph showing enlarged views of a Ge 2p portion of XPS measurement results for the interface between the $Si_{0.75}Ge_{0.25}$ layer and the first $Al_2O_3$ layer at each treatment. FIGS. 17A and 17B are a graph showing enlarged views of Al 2p portion of the XPS measurement results for the interface between the $Si_{0.75}Ge_{0.25}$ layer and the first $Al_2O_3$ layer at each treatment. While FIG. 17A shows a superposition of the XPS measurement results at each treatment, FIG. 17B shows the XPS measurement results separately at each treatment. The peak around 1221 eV shown in FIG. 16 is considered as a chemical shift of Ge atoms caused by bonding with O atoms or N atoms. It is understood from FIG. 16 and FIGS. 17A and 17B that Ge atoms are oxidized, nitrided or oxynitrided through the post-oxidation or post-nitridation but the bonding state of Al atoms remains unchanged. In other words, it is understood that the first $Al_2O_3$ layer is hardly affected by the plasma treatment but the $Si_{0.75}Ge_{0.25}$ layer thereunder is affected by the oxidation, nitridation, or oxynitridation. This indicates that the first $Al_2O_3$ layer serves as passivation for the SiGe layer, while the first $Al_2O_3$ layer is not affected by the plasma treatment and serves as a high-dielectric-constant insulating layer.

Figure 18:
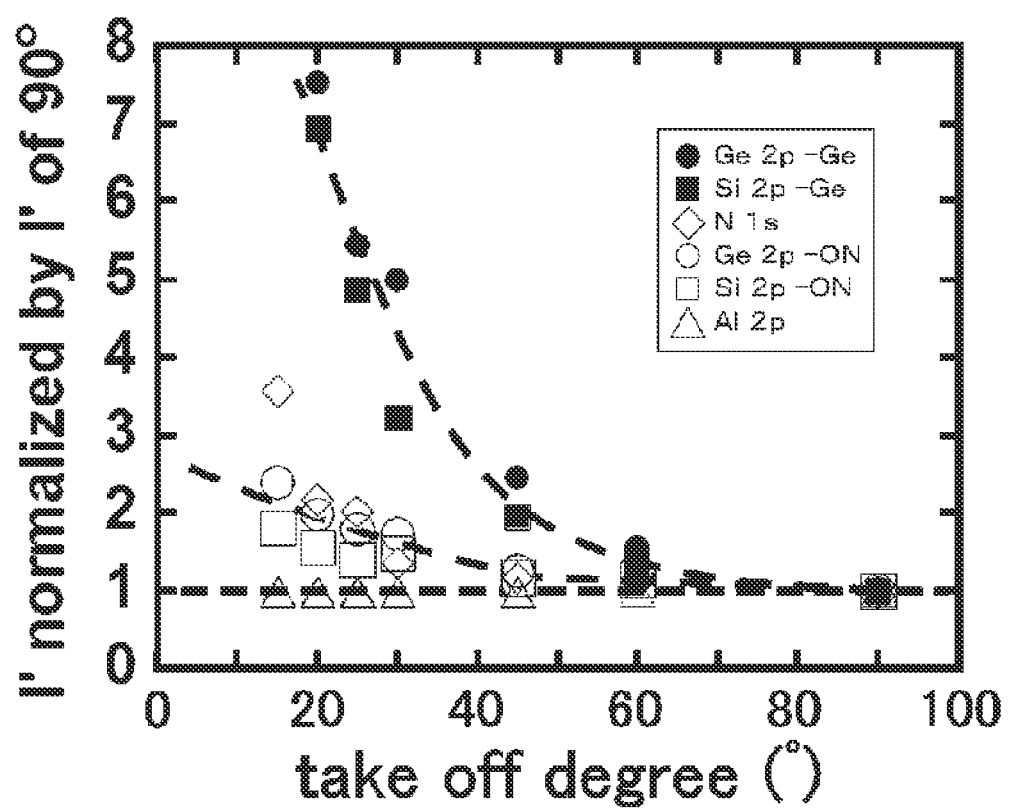
FIG. 18 is a graph showing angular-resolved X-ray photoelectron spectroscopy (XPS) measurement results of the interface between the $Si_{0.75}Ge_{0.25}$ layer and the first $Al_2O_3$ layer on which the post-nitridation is performed.

FIG. 18 is a graph showing angular-resolved X-ray photoelectron spectroscopy (XPS) measurement results of the interface between the $Si_{0.75}Ge_{0.25}$ layer and the first $Al_2O_3$ layer on which the post-nitridation was performed. The vertical axis shows the values normalized with a takeoff angle of 90 degrees for Al 2p peak divided by each chemical shift peak of Ge 2p (black circle), Si 2p (black square), oxynitrided Ge 2p (white circle), oxynitrided Si 2p (white square), and N1s. The horizontal axis shows a takeoff angle. It is understood from the results shown in FIG. 18 that the peaks that originate in the wafer (the black circle and the black square) become smaller (the values along the vertical axis increase) as the takeoff angle decreases, and it is considered that the peaks of the white circle, white square and the nitrogen are signals that stem from atoms situated between the front face and the wafer. In other words, this indicates that Ge atoms bonded to nitrogen, oxygen or both exist between the first $Al_2O_3$ layer and the SiGe layer, and this demonstrates that the interlayer 108 is formed.

Figure 19:
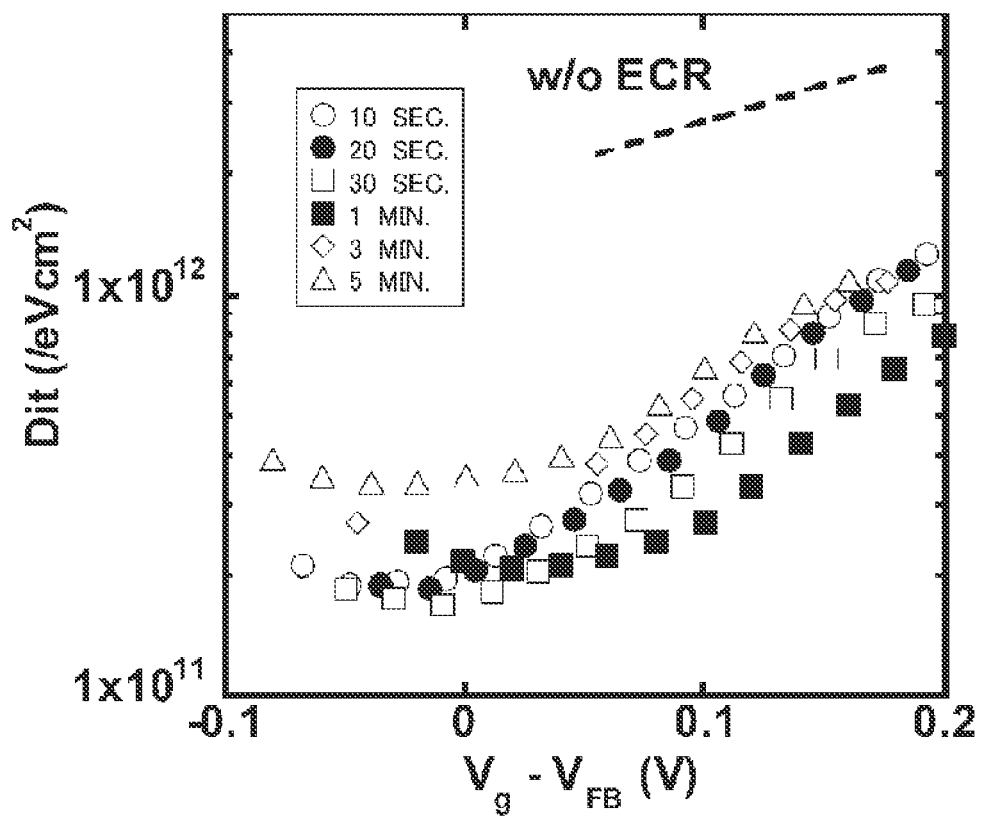
FIG. 19 is a graph illustrating distributions of the interface trap density along an energy axis when a treatment time of the post-nitridation is varied.
Figure 20:
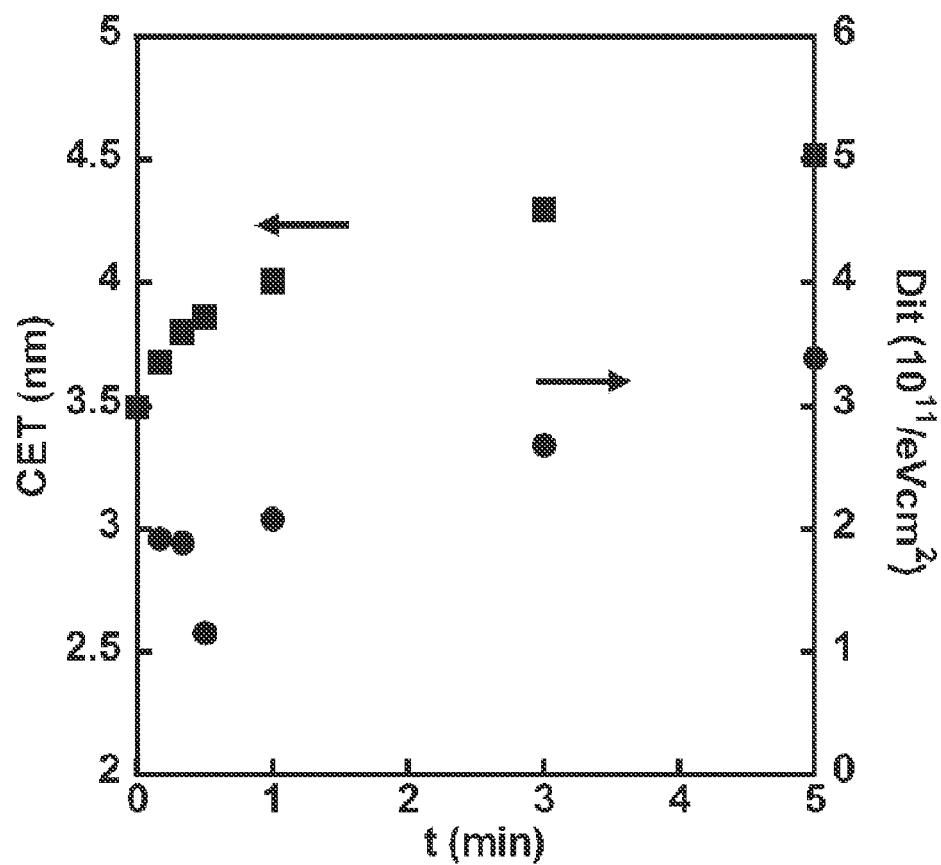
FIG. 20 is a graph of the minimum value of the interface trap density and a capacitance equivalent thickness (CET) of an oxide layer obtained through capacitance measurement with a horizontal axis of treatment time.

FIG. 19 is a graph illustrating distributions of the interface trap density on an energy axis when a treatment time of the post-nitridation is varied. FIG. 20 is a graph of the minimum value of the interface trap density and a capacitance equivalent thickness (CET) of the oxide layer obtained through capacitance measurement with a horizontal axis of treatment time. It is understood from the graph that the treatment time can be as short as 10 seconds but a long treatment time adversely increases the interface trap density. In other words, there is an optimal value of the plasma treatment time. In the specification herein, CET (Capacitance equivalent thickness) is determined directly from the measurement of capacitance for a MOS structure, and includes a quantization effect, namely, an effect where electronic states in an inversion layer are quantized and energy at the smallest level is not zero, and further includes an effect where electrons are not distributed at the most surface. In contrast, EOT (Equivalent oxide thickness) does not include the quantization effect and is a value where electrons are assumed to be distributed also at the most surface. The relationship between EOT and CET can be quantitatively determined by the following formula.

EOT=CET−0.3 (nm)

Figure 21:
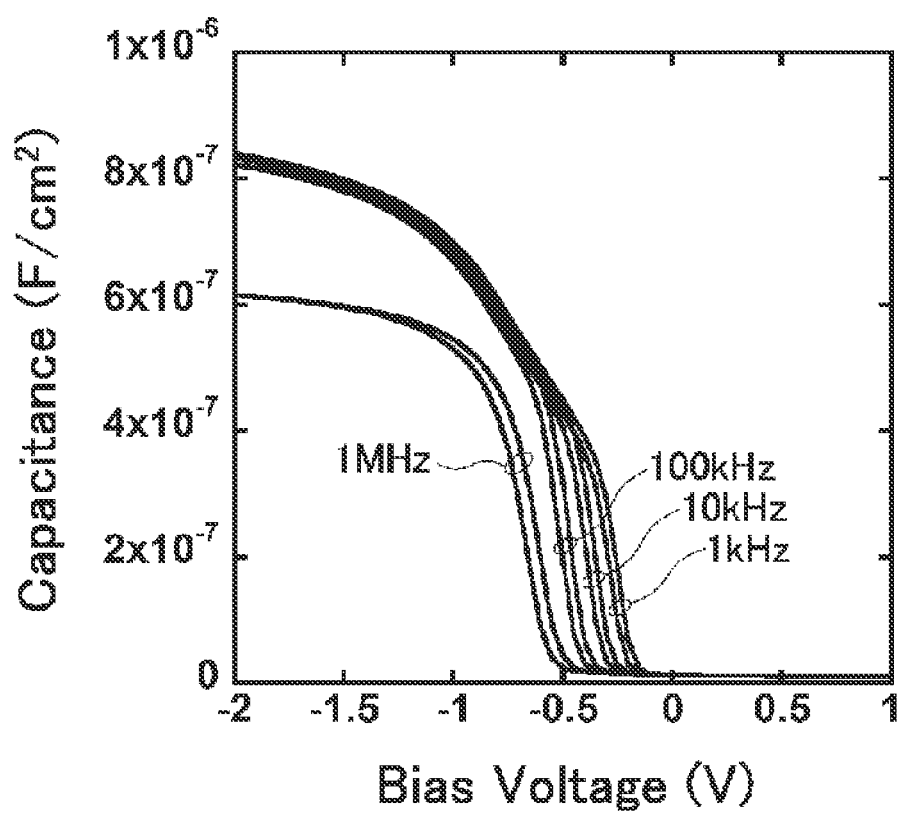
FIG. 21 is a graph of CV characteristics when the thickness of a first insulating layer in a post-nitrided MOS structure corresponds to ALD treatment of 0 cycles.
Figure 22:
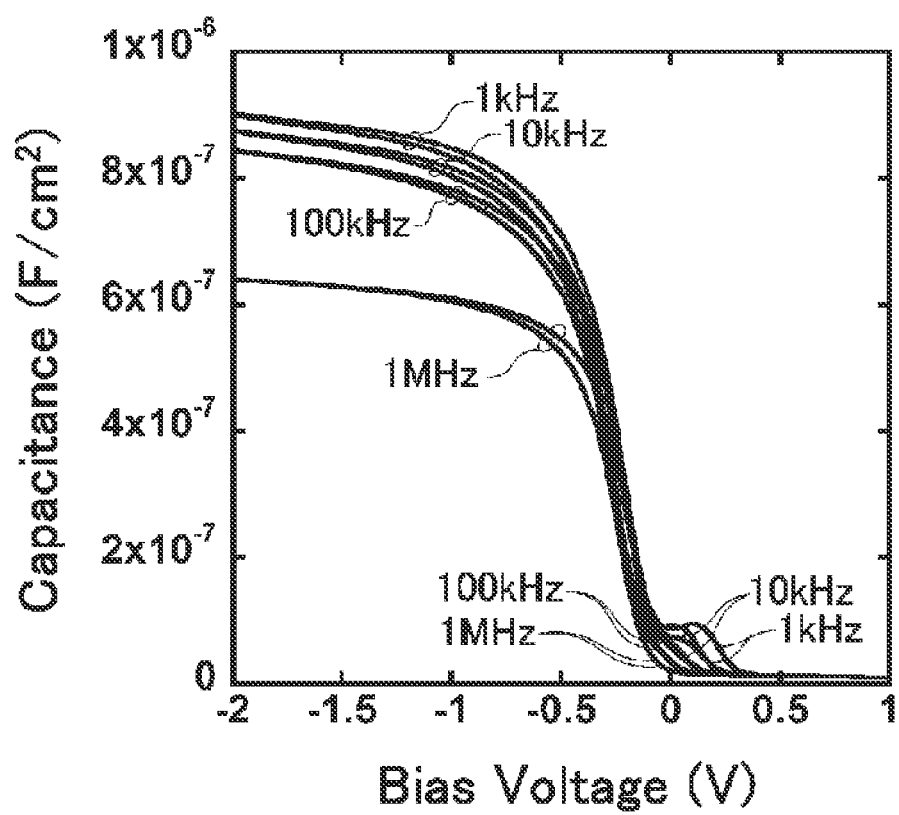
FIG. 22 is a graph of CV characteristics when the thickness of the first insulating layer in the post-nitrided MOS structure corresponds to ALD treatment of 2 cycles.
Figure 23:
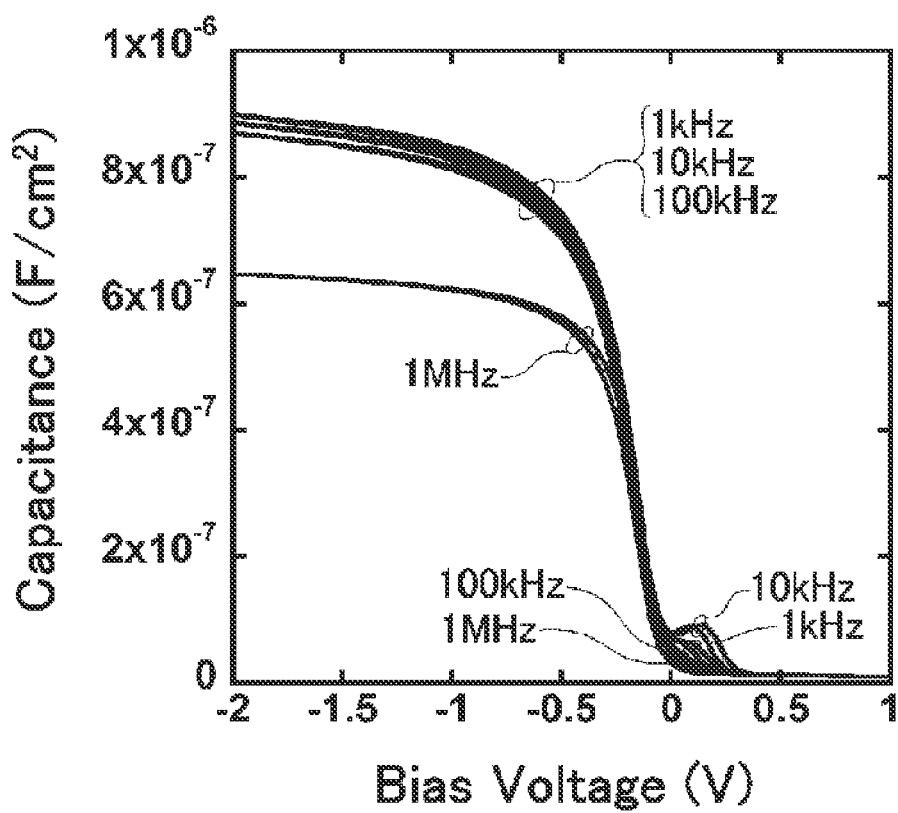
FIG. 23 is a graph of CV characteristics when the thickness of the first insulating layer in the post-nitrided MOS structure corresponds to ALD treatment of 4 cycles.
Figure 24:
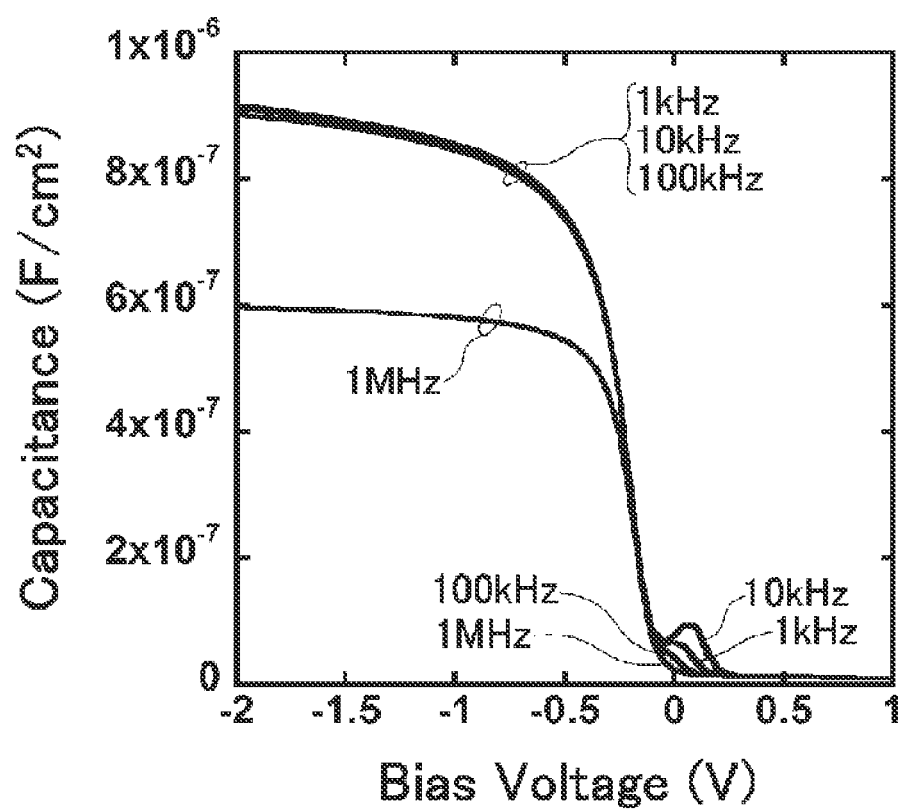
FIG. 24 is a graph of CV characteristics when the thickness of the first insulating layer in the post-nitrided MOS structure corresponds to ALD treatment of 6 cycles.
Figure 25:
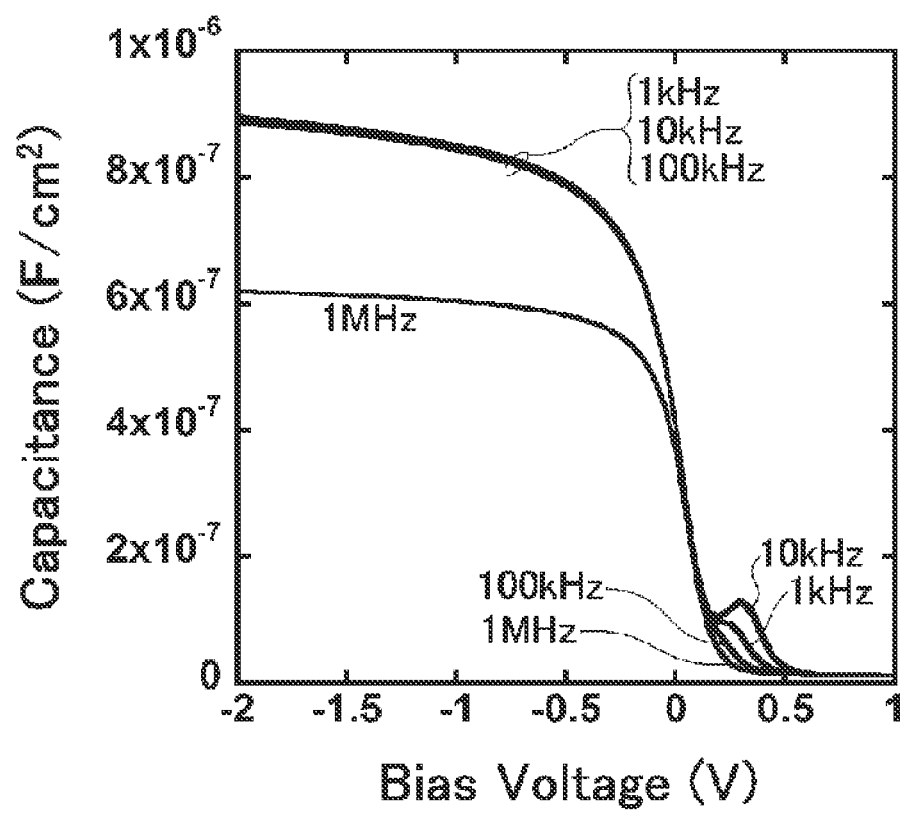
FIG. 25 is a graph of CV characteristics when the thickness of the first insulating layer in the post-nitrided MOS structure corresponds to ALD treatment of 8 cycles.
Figure 26:
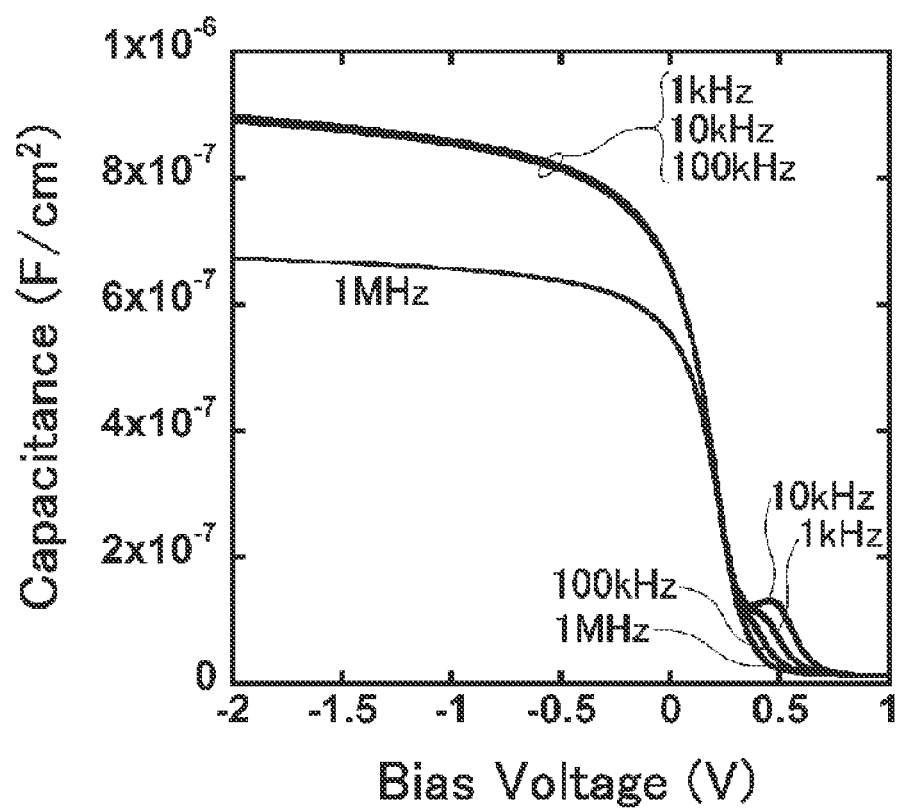
FIG. 26 is a graph of CV characteristics when the thickness of the first insulating layer in the post-nitrided MOS structure corresponds to ALD treatment of 10 cycles.
Figure 27:
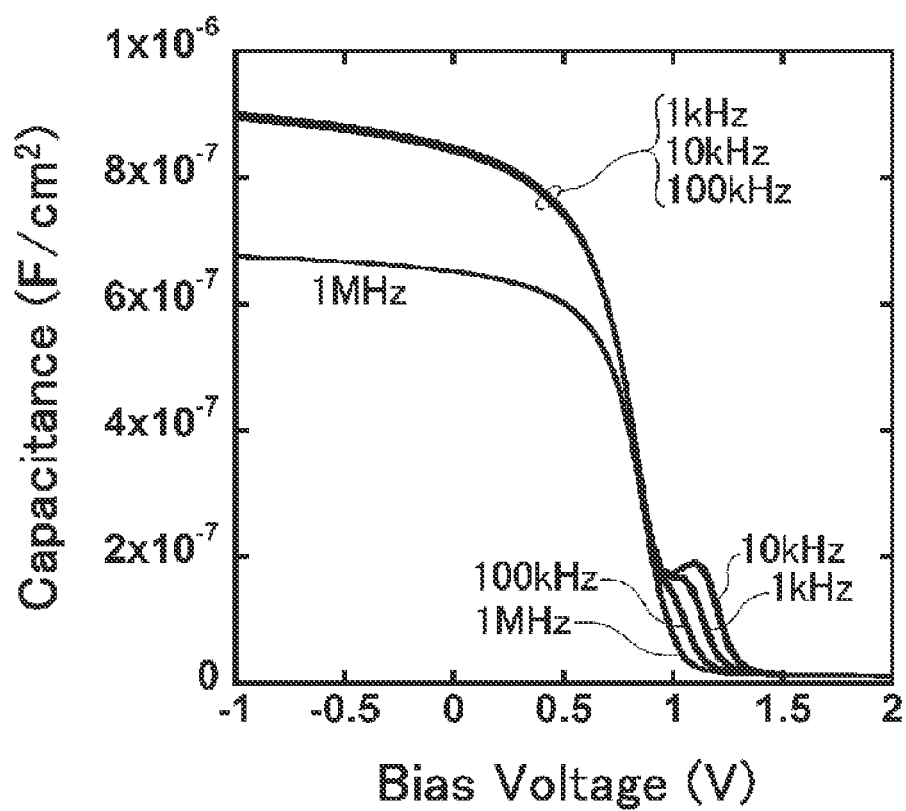
FIG. 27 is a graph of CV characteristics when the thickness of the first insulating layer in the post-nitrided MOS structure corresponds to ALD treatment of 20 cycles.
Figure 28:
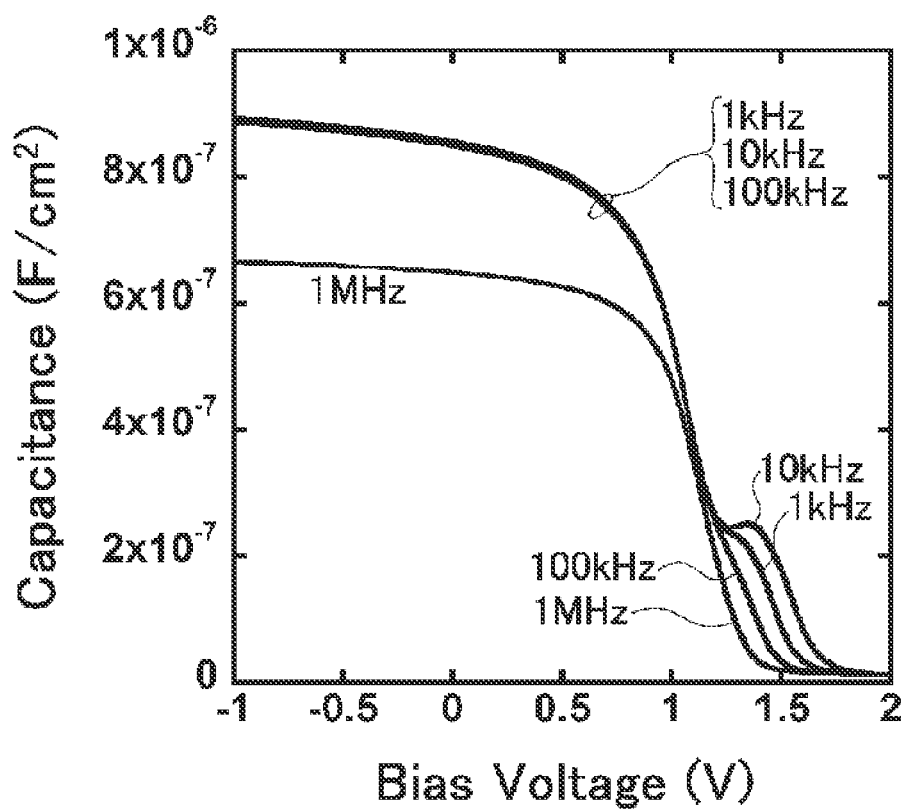
FIG. 28 is a graph of CV characteristics when the thickness of the first insulating layer in the post-nitrided MOS structure corresponds to ALD treatment of 30 cycles.
Figure 29:
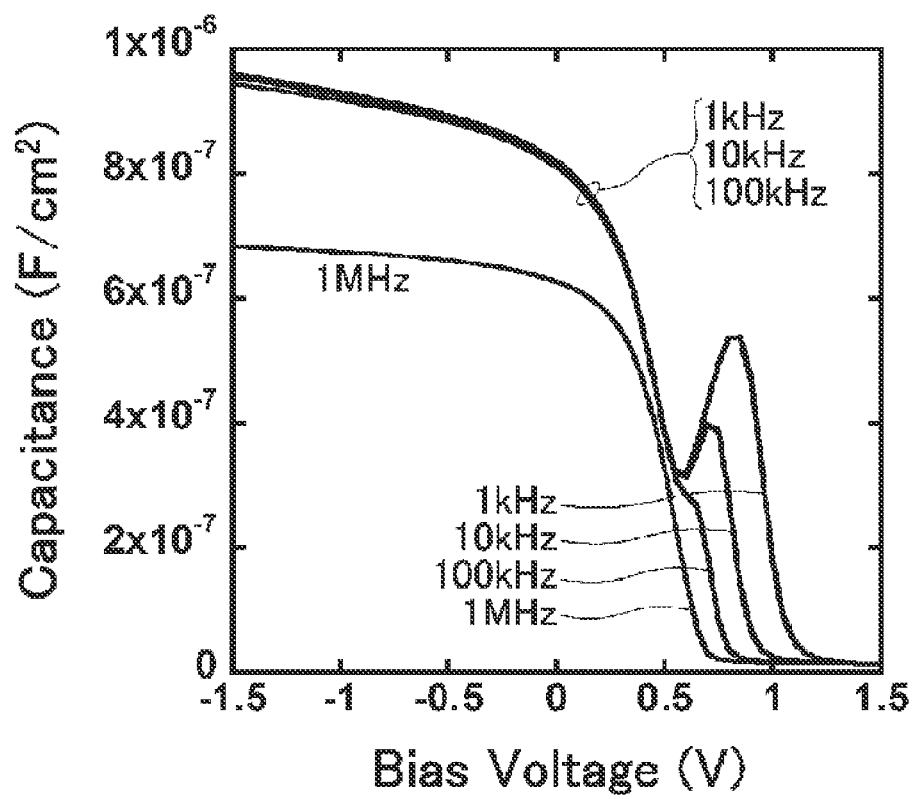
FIG. 29 is a graph of CV characteristics when the MOS structure is untreated for comparison.

FIGS. 21 through 28 are graphs of the CV characteristics for the post-nitrided MOS structures where the thickness of the first insulating layer 106 or the first $Al_2O_3$ layer is varied. The thickness of the first $Al_2O_3$ layer is represented as the number of cycles in the ALD method. FIG. 21 shows the case of 0 cycle, FIG. 22 shows the case of 2 cycles, FIG. 23 shows the case of 4 cycles, FIG. 24 shows the case of 6 cycles, FIG. 25 shows the case of 8 cycles, FIG. 26 shows the case of 10 cycles, FIG. 27 shows the case of 20 cycles, and FIG. 28 shows the case of 30 cycles. A thickness of 6 to 8 cycles corresponds to about 1 nm, and a thickness of 30 cycles corresponds to about 3 nm. FIG. 29 is a graph of the CV characteristics where the MOS structure is untreated for comparison.

It is obvious from the results shown in FIGS. 21 to 29 that the interface trap density is smallest when the thickness of the first $Al_2O_3$ layer is 6 to 8 cycles or about 1 nm, and an effect of hysteresis is small. The effect by the plasma treatment is small when the number of the cycles is large (the thickness of the first $Al_2O_3$ layer is large), and it is assumed that hysteresis occurs due to plasma damage or the like when the number of the cycles is small (the layer is thin). In other words, there is an optimal value of the thickness of the first insulating layer 106 when performing the plasma treatment with a certain power.

Figure 30:
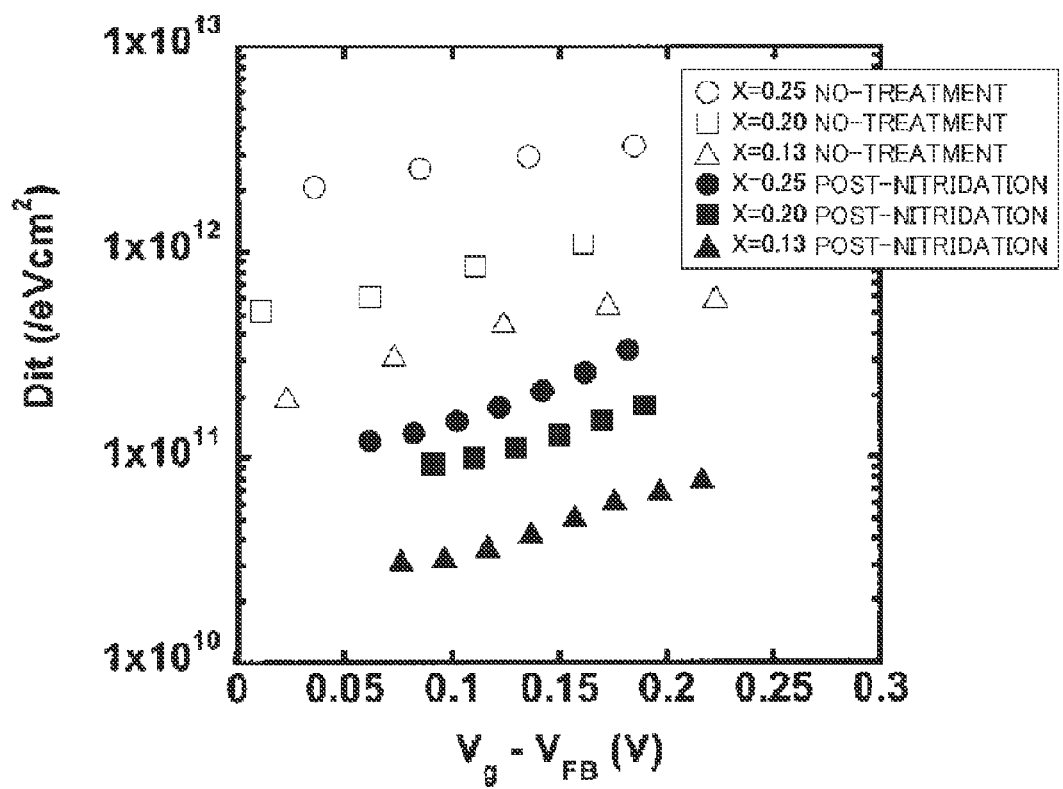
FIG. 30 is a graph showing distributions of the interface trap densities along an energy axis when Ge ratio x is varied in $Si_{1-x}Ge_x$ in the cases of the post nitridation and no treatment.

FIG. 30 is a graph showing distributions of the interface trap densities along an energy axis where Ge ratio x is varied in $Si_{1-x}Ge_x$ in the cases of the post nitridation and no-treatment. It is understood from the graph that while the interface trap density increases as the Ge ratio x increases, the interface trap density is suppressed to a low value in the case of the post-nitridation.

EXAMPLE 2

Semiconductor wafers were fabricated such that the thickness of the first $Al_2O_3$ layer for the first insulating layer 106 was varied as 0.09 nm, 0.28 nm, 0.50 nm, 0.68 nm, and 0.84 nm and $N_2$ ECR plasma power used for the post-nitridation was varied as 650 W, 400 W, 250 W, and 150 W. Other conditions were the same as those of Example 1. Various MOS structures were obtained using the fabricated semiconductor wafers in the same manner as Example 1.

Figure 31:
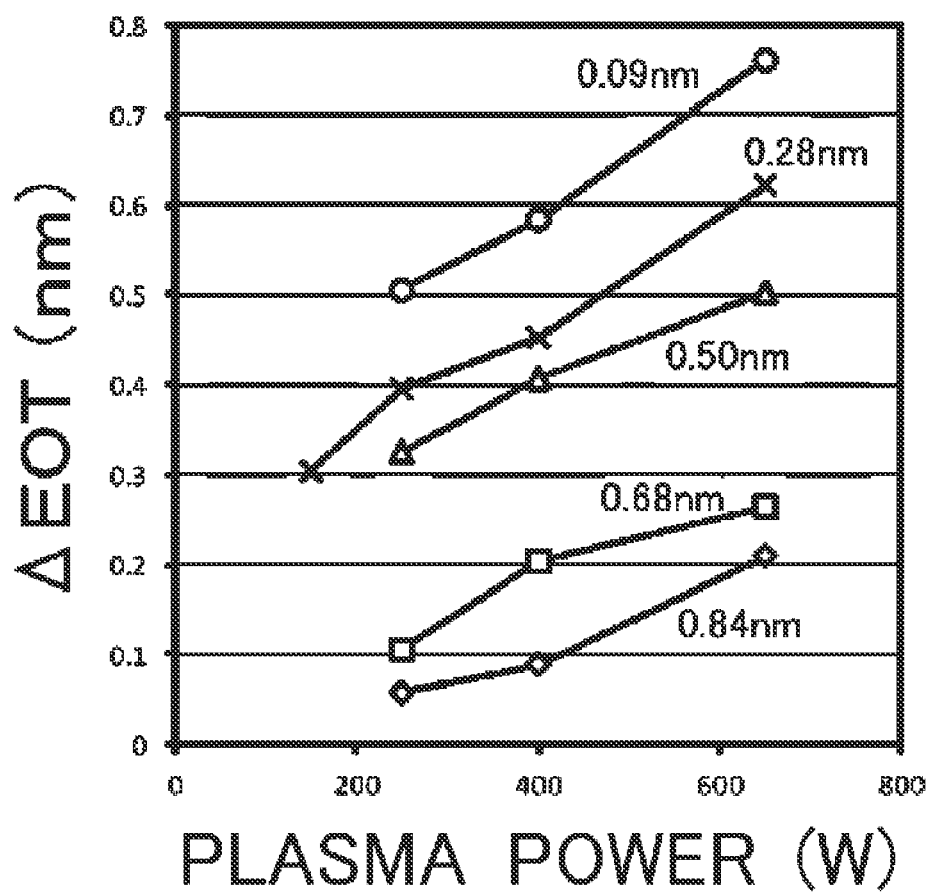
FIG. 31 is a graph showing ΔEOTs of various MOS structures fabricated in Example 2.

FIG. 31 is a graph showing ΔEOTs of the various MOS structures fabricated in Example 2. ΔEOT represents a value obtained by subtracting an EOT value of a MOS structure on which post-nitridation is not performed from an EOT value of a MOS structure on which post-nitridation is performed, in other words, ΔEOT represents an EOT increase due to the post-nitridation. It is understood from FIG. 31 that the smaller the thickness of the first $Al_2O_3$ layer, the larger ΔEOT at the same plasma power. It is also understood that the larger the $N_2$ ECR plasma power, the larger $\Delta$EOT in the same thickness of the $Al_2O_3$ layer. As it is considered that the smaller the thickness of the first $Al_2O_3$ layer and the larger the $N_2$ ECR plasma power, the larger the energy given to the interface between the first $Al_2O_3$ layer and the SiGe layer which is original semiconductor crystal layer 103, it can be assumed that the interlayer 108 is formed to have a larger thickness, or is heavily-nitrided or heavily-oxidized. Degree of the nitridation or oxidation is reflected to the dielectric constant of the interlayer 108, so that the increase of EOT or $\Delta$EOT due to the post-nitridation can be considered as the thickness of the inter layer 108 that includes the dielectric constant (the amount of the interlayer formation).

Figure 32:
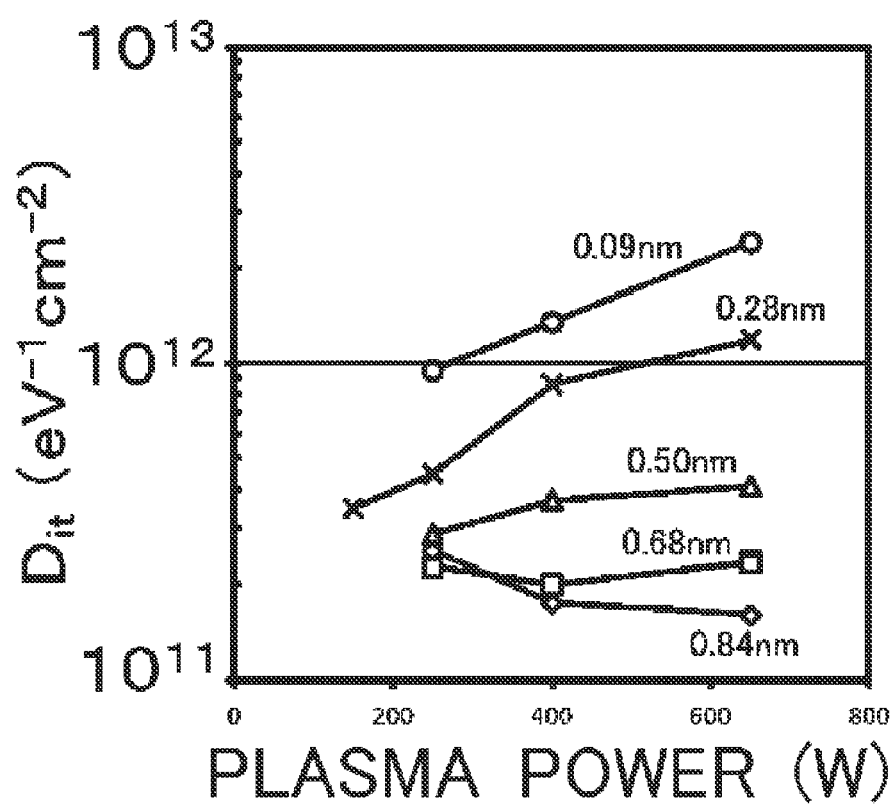
FIG. 32 is a graph showing the interface trap densities ($D_{it}$) of the various MOS structures fabricated in Example 2.

FIG. 32 is a graph showing interface trap densities ($D_{it}$) of various MOS structures fabricated in Example 2. The interface trap density increased as the $N_2$ ECR plasma power increased when the thickness of first $Al_2O_3$ layer was 0.09 nm, 0.28 nm, and 0.50 nm. In contrast, the interface trap density decreased as the $N_2$ ECR plasma power increased when the thickness of the first $Al_2O_3$ layer was 0.84 nm. When the thickness of first $Al_2O_3$ layer was 0.68 nm, tendency of the interface trap density was not clear.

Considering the results shown in FIG. 31 and FIG. 32 together, it was understood that there are two situations in terms of the post-nitridation treatment. One is a first situation where $\Delta$EOT increases as the $N_2$ ECR plasma power increases, and consequently the interface trap density increases as shown by the cases of the first $Al_2O_3$ layer with the thicknesses of 0.09 nm, 0.28 nm, and 0.50 nm. Another is a second situation where $\Delta$EOT increases as the $N_2$ ECR plasma power increases but the interface trap density decreases as shown by the cases of the first $Al_2O_3$ layer with the thickness of 0.84 nm. In the second situation, $\Delta$EOT increases and the interface trap density decreases, so such state can be considered as a state where there is still room for the interface trap density to be further decreased by the post-nitridation. In the first situation, the interface trap density does not decrease any more even when $\Delta$EOT increases, and this situation can be interpreted, as is the case for the pre-nitridation, as a state where plasma damage is large and any more post-nitridation can increase the interface trap density.

Figure 33:
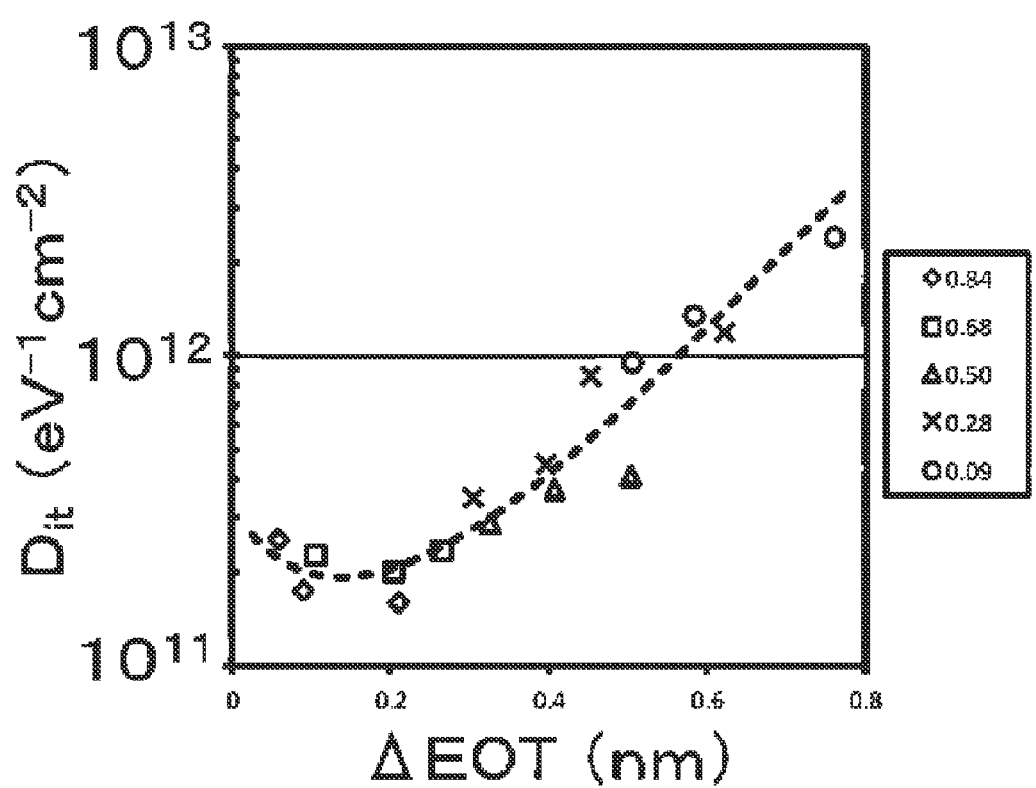
FIG. 33 is a scatter plot of the interface trap densities vs ΔEOTs of the various MOS structures fabricated in Example 2.

FIG. 33 is a scatter plot of the interface trap densities vs $\Delta$EOTs of the various MOS structures fabricated in Example 2. It is understood from the plot that there is correlation as shown by the dotted line irrespective of the thickness of the first $Al_2O_3$ layer. More specifically, it is considered that the region where $\Delta$EOT is larger than about 0.15 nm corresponds to the first situation above, and the region where $\Delta$EOT is smaller than about 0.15 nm corresponds to the second situation above, so it can be said that there is an optimum value of $\Delta$EOT to minimize the interface trap density. As stated above, $\Delta$EOT can be considered as the amount of the interlayer 108 formation, and therefore it is derived that there is an optimal value for the amount of the interlayer 108 to be formed. In other words, it is possible to control the relation between $\Delta$EOT and the interface trap density by adequately selecting the $N_2$ ECR plasma power and the thickness of the first insulating layer 106. In this example, it was possible to reduce the interface trap density to $2 \times 10^{11}$ [$eV^{-1}cm^{-2}$] when $\Delta$EOT was 0.15 nm. Even when the thickness of the first $Al_2O_3$ layer was 0.28 nm, it was possible to minimize an increase of EOT from that of the case where plasma exposure is not performed, to 0.5 nm or less by setting the plasma power to 150 W, and consequently it was possible to reduce the interface trap density to $1 \times 10^{12}$ [$eV^{-1}cm^{-2}$] or less. As illustrated in FIG. 33, the thickness of the first insulating layer 106 and the $N_2$ ECR plasma power may be controlled to set $\Delta$EOT to a value that minimizes the interface trap density. In this example, $\Delta$EOT may be controlled to be 0.5 nm or less, or may be controlled to fall in a range of 0.05 nm to 0.2 nm. Moreover, the thickness of the first insulating layer 106 may be minimized under conditions where the plasma power of the plasma processing apparatus is set such that plasma can be maintained and where $\Delta$EOT has a value in the above-mentioned range.

EXAMPLE 3

Figure 34:
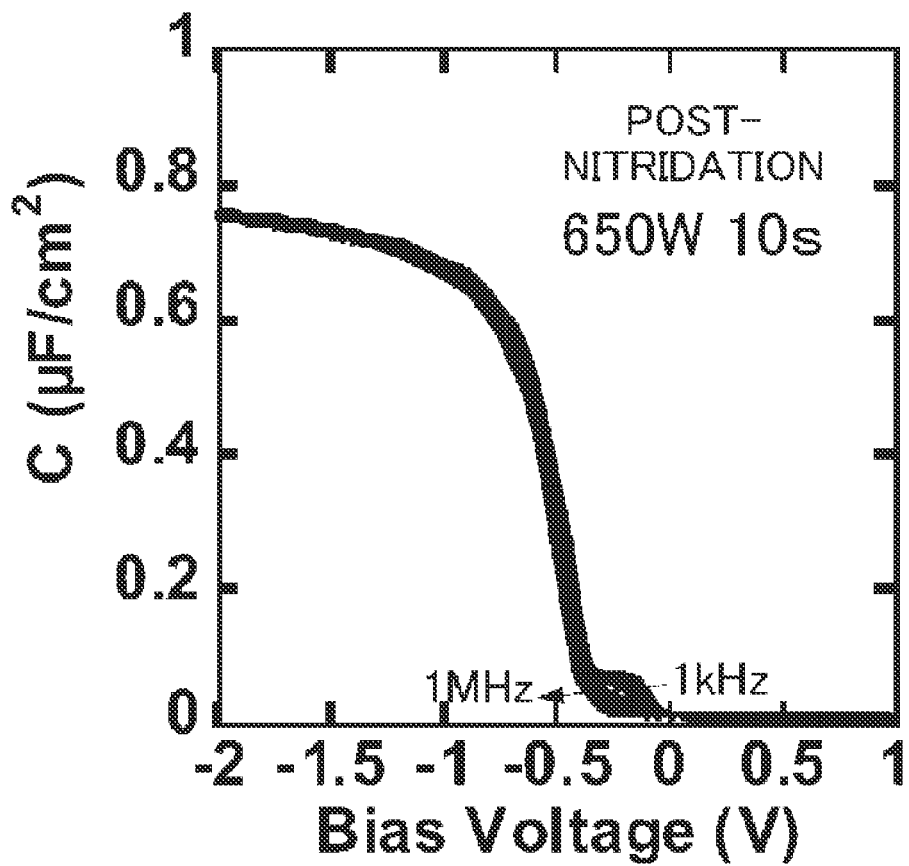
FIG. 34 is a graph of CV characteristics of a MOS structure when $N_2$ ECR plasma power is 650 W and post-nitridation is performed.
Figure 35:
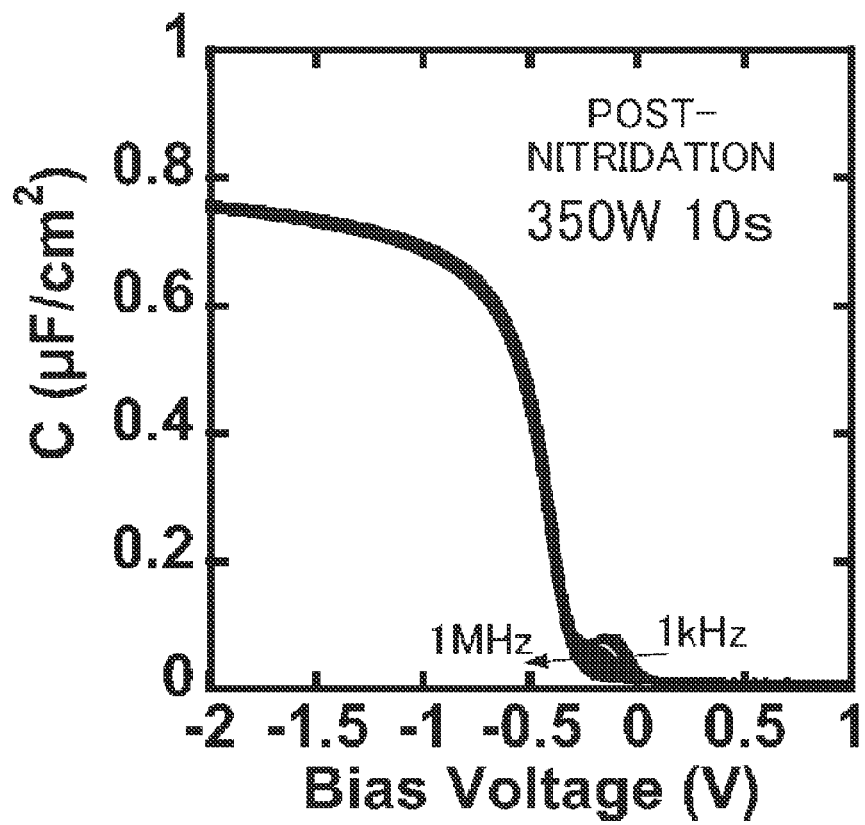
FIG. 35 is a graph of CV characteristics of a MOS structure when the $N_2$ ECR plasma power is 350 W and post-nitridation is performed.
Figure 36:
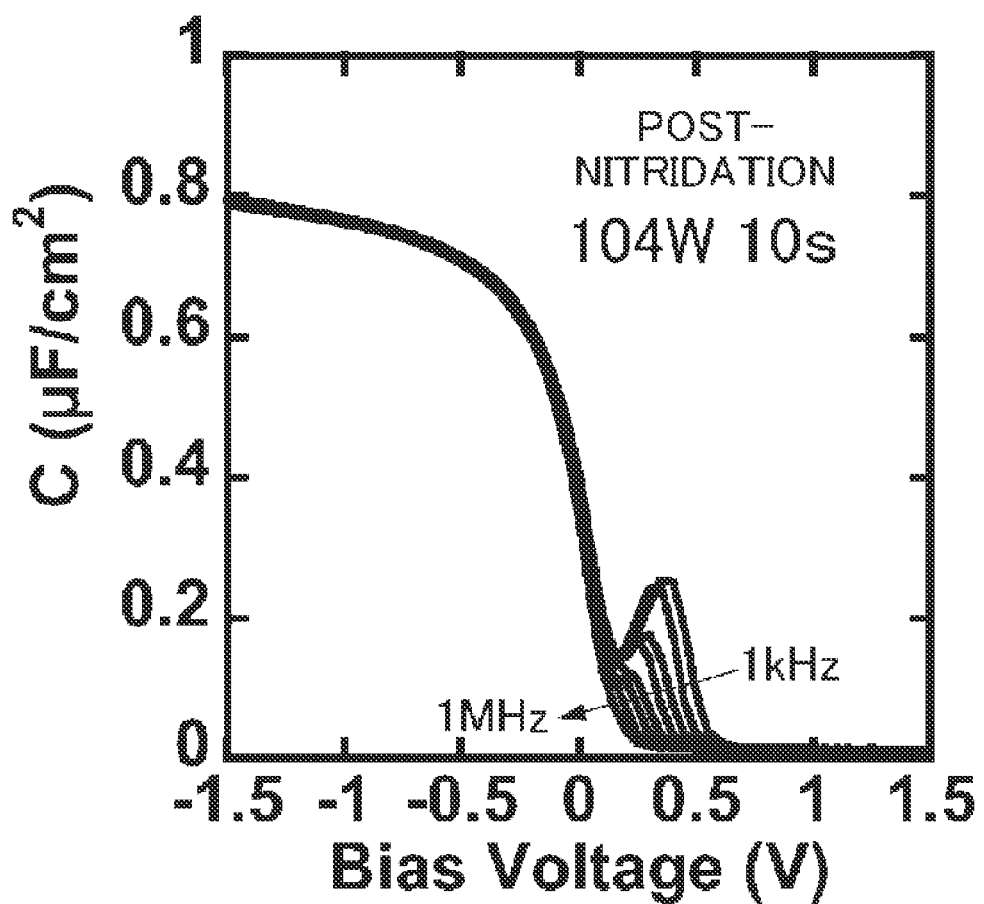
FIG. 36 is a graph of CV characteristics of a MOS structure when the $N_2$ ECR plasma power is 104 W and post-nitridation is performed.
Figure 37:
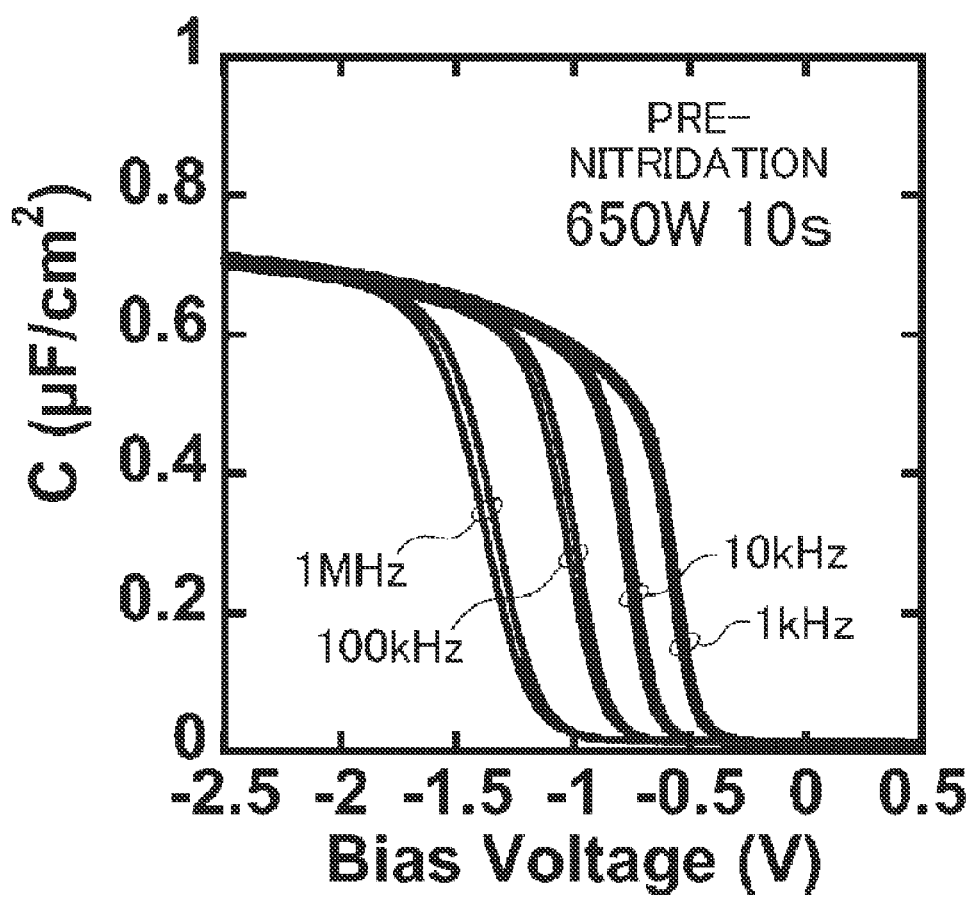
FIG. 37 is a graph of CV characteristics of a MOS structure when the $N_2$ ECR plasma power is 650 W and pre-nitridation is performed.
Figure 38:
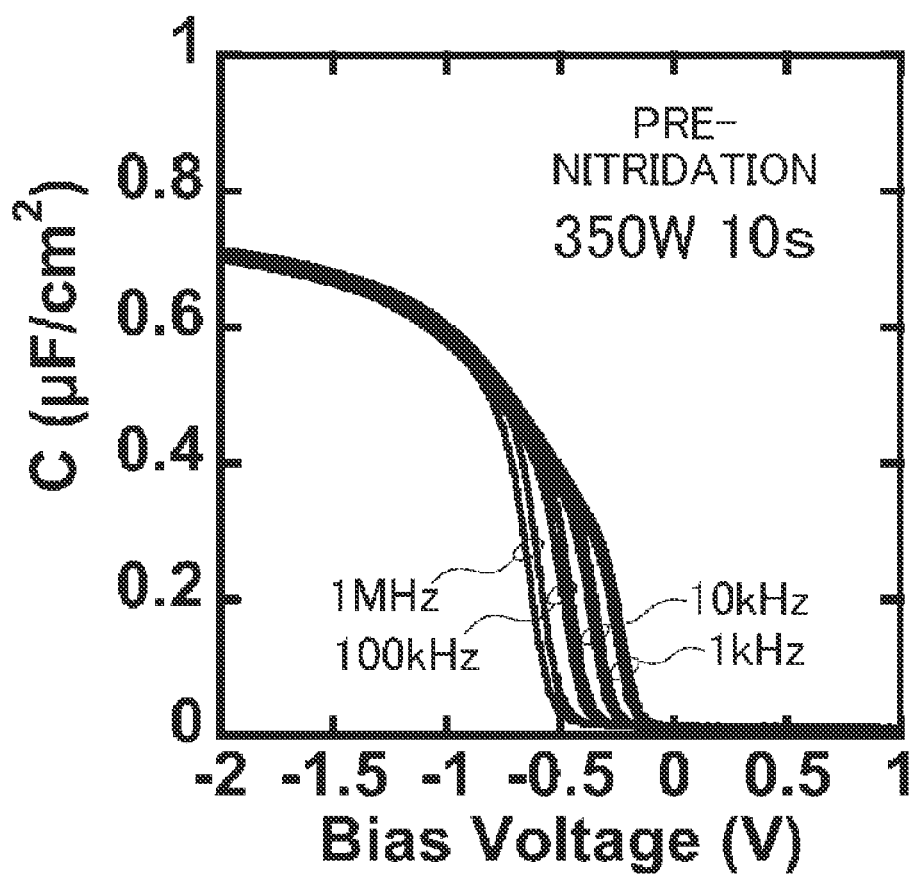
FIG. 38 is a graph of CV characteristics of a MOS structure when the $N_2$ ECR plasma power is 350 W and pre-nitridation is performed.
Figure 39:
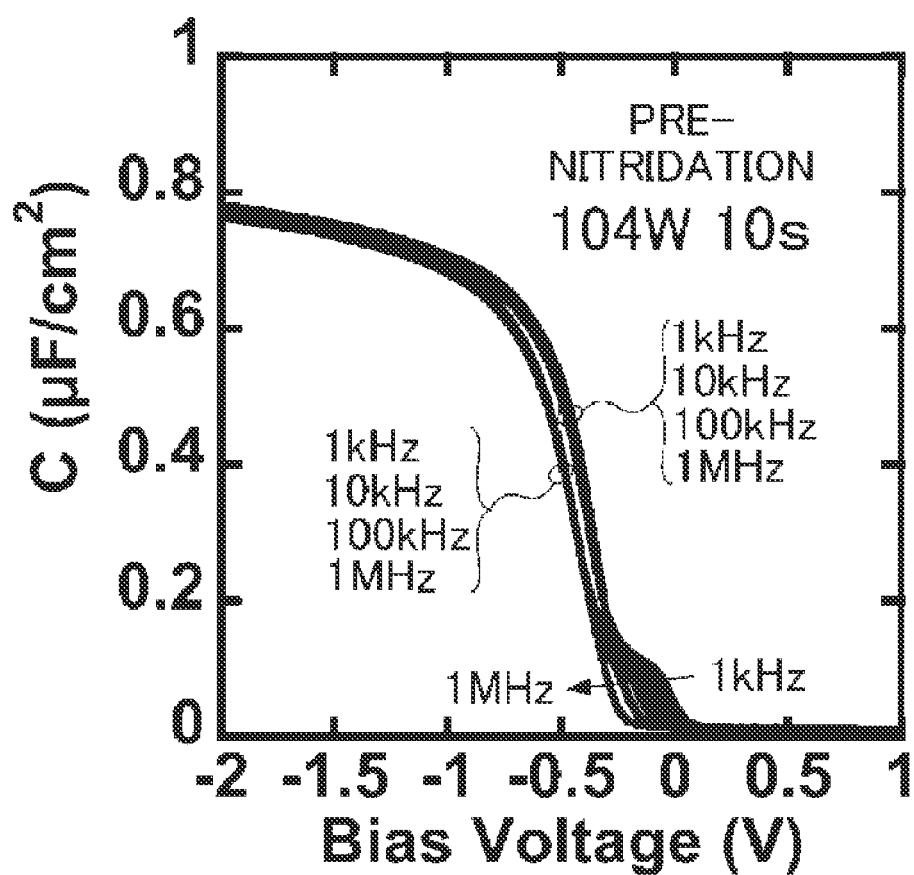
FIG. 39 is a graph of CV characteristics of a MOS structure when the $N_2$ ECR plasma power is 104 W and pre-nitridation is performed.
Figure 40:
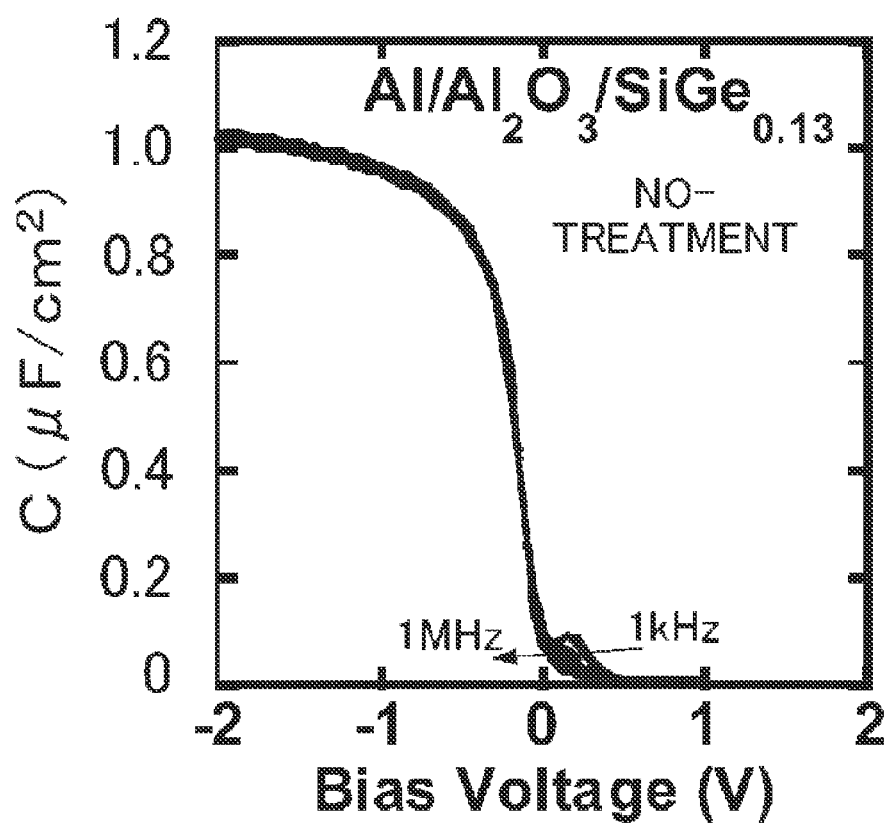
FIG. 40 is a graph of CV characteristics of a MOS structure when the Ge ratio x in $Si_{1-x}Ge_x$ is 0.13 and no plasma exposure (no-treatment) is performed.
Figure 41:
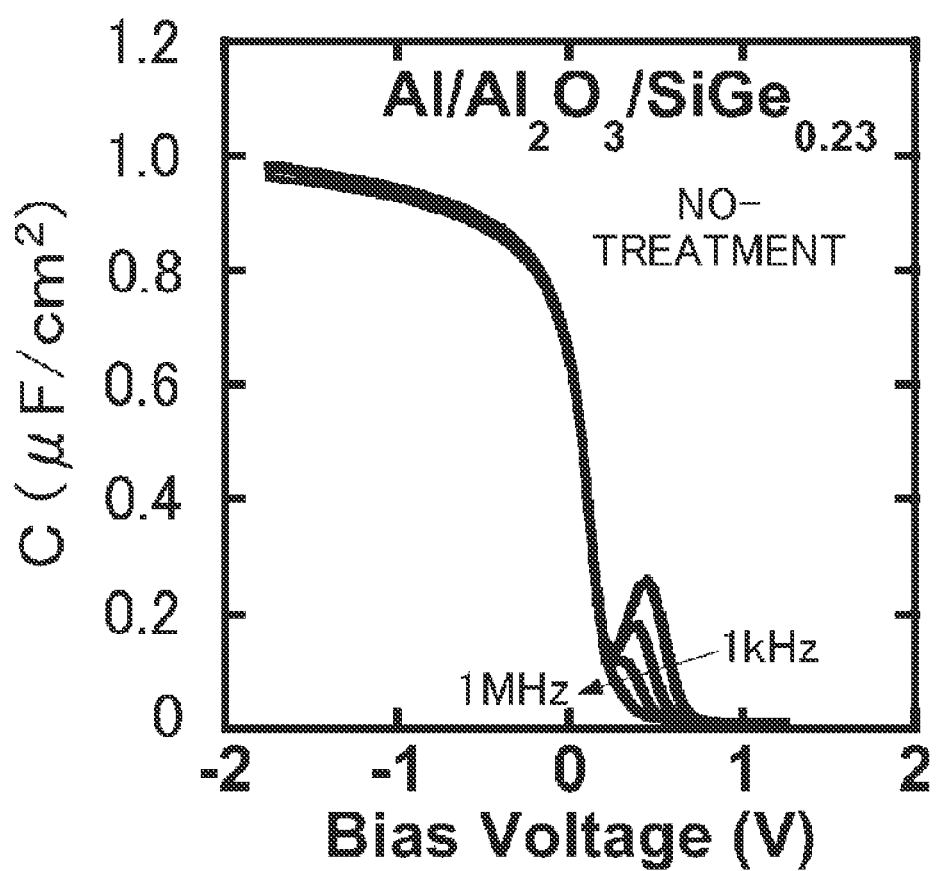
FIG. 41 is a graph of CV characteristics of a MOS structure when the Ge ratio x in $Si_{1-x}Ge_x$ is 0.23 and no plasma exposure (no-treatment) is performed.
Figure 42:
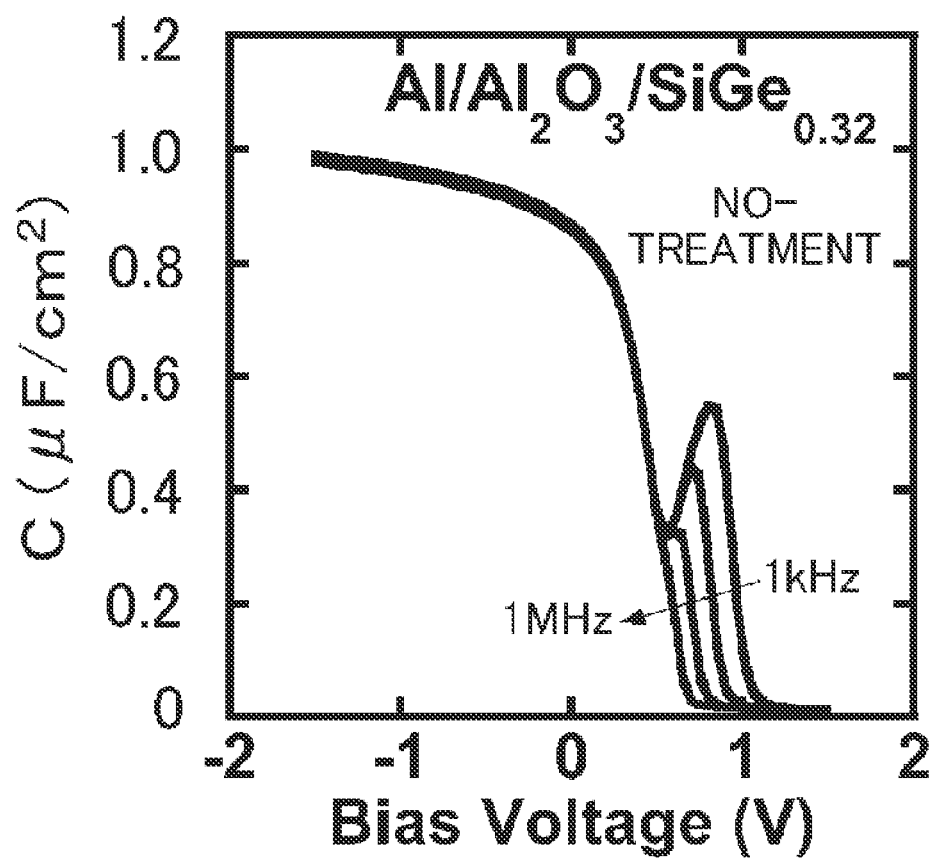
FIG. 42 is a graph of CV characteristics of a MOS structure when the Ge ratio x in $Si_{1-x}Ge_x$ is 0.32 and no plasma exposure (no-treatment) is performed.
Figure 43:
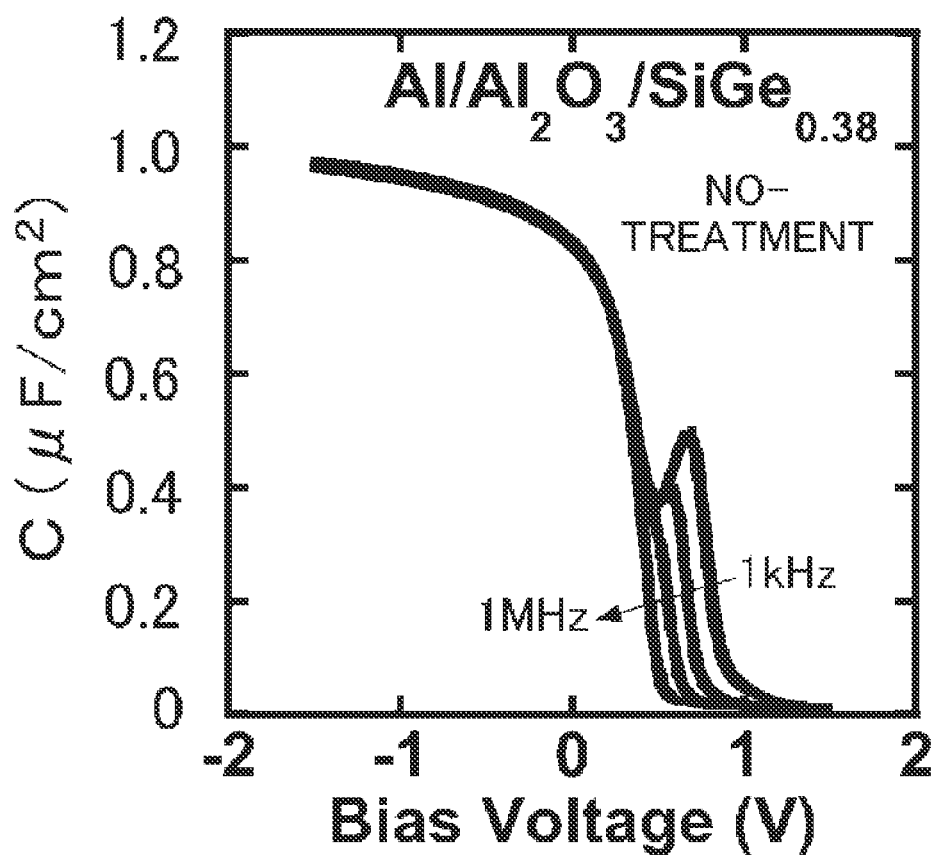
FIG. 43 is a graph of CV characteristics of a MOS structure when the Ge ratio x in $Si_{1-x}Ge_x$ is 0.38 and no plasma exposure (no-treatment) is performed.
Figure 44:
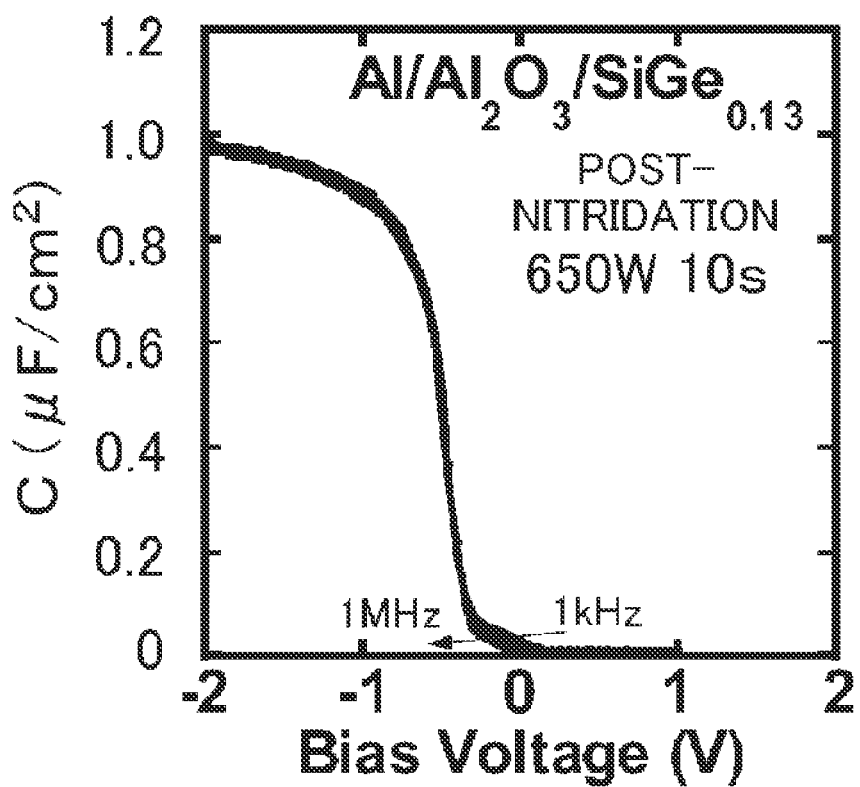
FIG. 44 is a graph of CV characteristics of a MOS structure when the Ge ratio x in $Si_{1-x}Ge_x$ is 0.13 and the post-nitridation is performed.
Figure 45:
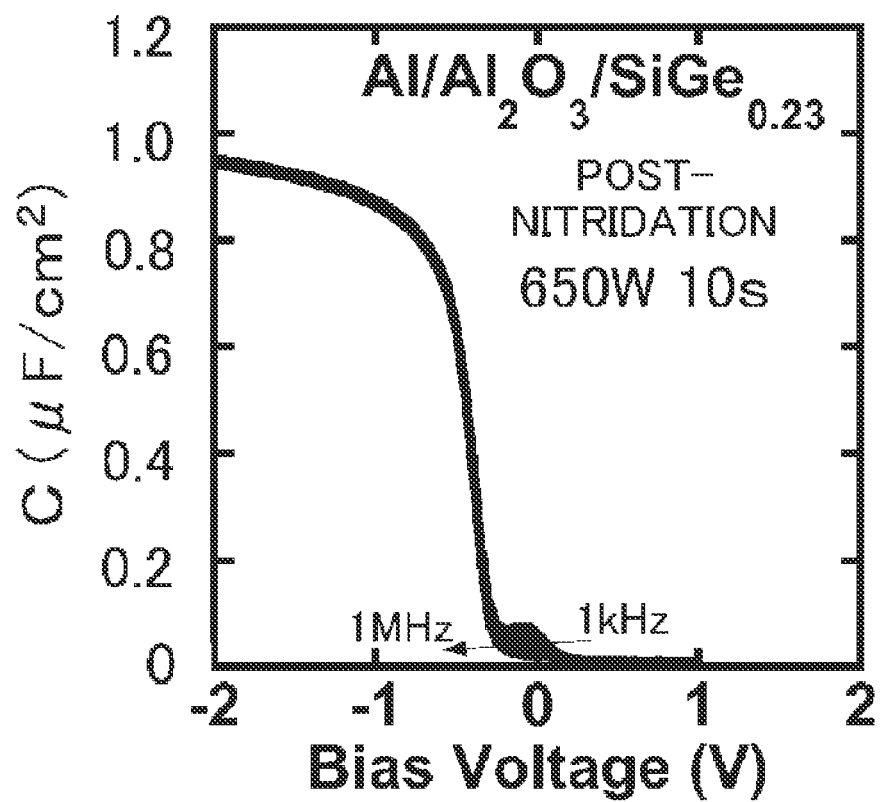
FIG. 45 is a graph of CV characteristics of a MOS structure when the Ge ratio x in $Si_{1-x}Ge_x$ is 0.23 and the post-nitridation is performed.
Figure 46:
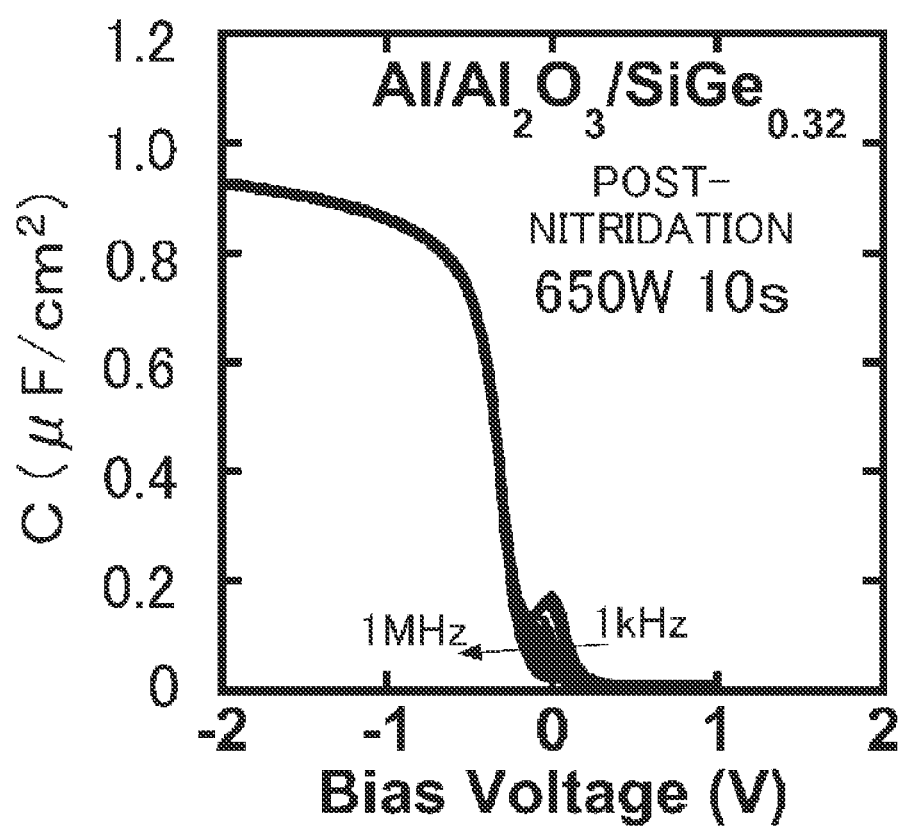
FIG. 46 is a graph of CV characteristics of a MOS structure when the Ge ratio x in $Si_{1-x}Ge_x$ is 0.32 and the post-nitridation is performed.
Figure 47:
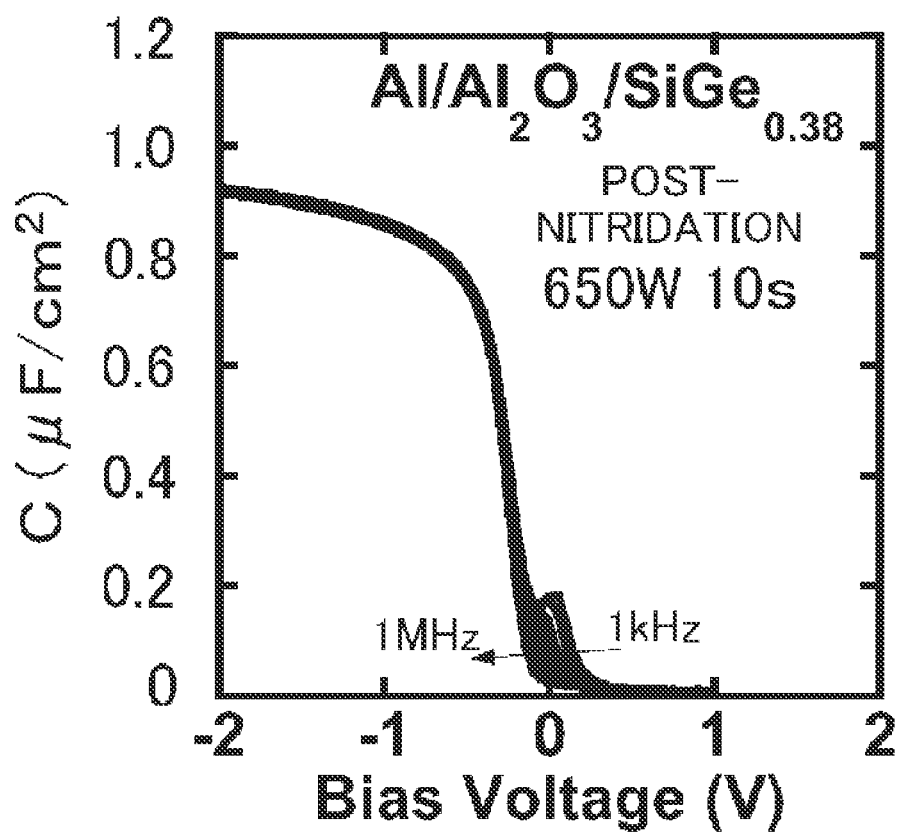
FIG. 47 is a graph of CV characteristics of a MOS structure when the Ge ratio x in $Si_{1-x}Ge_x$ is 0.38 and the post-nitridation is performed.

Semiconductor wafers were fabricated in the same manner as Example 1 except that the $N_2$ ECR plasma power for the post-nitridation was varied as 650 W, 350 W, and 104 W. Various MOS structures were obtained using the fabricated semiconductor wafers in the same manner as Example 1. FIGS. 34 to 36 show graphs of CV characteristics of the MOS structures. FIG. 34 is a graph of CV characteristics of a MOS structure when the $N_2$ ECR plasma power was 650 W. FIG. 35 is a graph of CV characteristics of a MOS structure when the $N_2$ ECR plasma power was 350 W. FIG. 36 is a graph of CV characteristics of a MOS structure when the $N_2$ ECR plasma power was 104 W. FIGS. 37 to 39 show graphs of CV characteristics of MOS structures on which pre-nitridation was performed for comparison. FIG. 37 shows the case where the $N_2$ ECR plasma power was 650 W, FIG. 38 shows the case where the $N_2$ ECR plasma power was 350 W, and FIG. 39 shows the case where the $N_2$ ECR plasma power was 104 W.

In this Example 3, the thickness of the first insulating layer 106 was 1 nm, which is larger than that in Example 2, and therefore a better CV characteristics was obtained as the $N_2$ ECR plasma power increased. All the CV characteristics of the MOS structures obtained through the post-nitridation at any of the $N_2$ ECR plasma powers were better than those of the MOS structure obtained through the pre-nitridation in the comparison examples, and it was assumed that the interface trap densities were smaller than those of the comparison examples.

EXAMPLE 4

Semiconductor wafers were fabricated in the same manner as Example 1 except that Ge ratio x of i-type $Si_{1-x}Ge_x$, which is the original semiconductor crystal layer 103, was varied in a range of 0.13 to 0.38. For comparison, semiconductor wafers that had the same Ge ratio but the plasma treatment was not performed were also fabricated in the same way. MOS structures were obtained using the fabricated semiconductor wafers in the same manner as Example 1, and CV characteristics of the MOS structures were measured. FIGS. 40, 41, 42, and 43 show CV characteristics of the MOS structures when the Ge ratio x in the i-type $Si_{1-x}Ge_x$ was 0.13, 0.23, 0.32, and 0.38 respectively and the plasma treatment was not performed. FIGS. 44, 45, 46, and 47 show CV characteristics of the MOS structures when the Ge ratio x in the i-type $Si_{1-x}Ge_x$ was 0.13, 0.23, 0.32, and 0.38 respectively and the post-nitridation was performed. Comparing these CV characteristics with the same composition, it can be seen that performing the post-nitridation made the bumps in the CV characteristics curves smaller, which demonstrates the fact that the interlayer 108 was formed by the post-nitridation and it was possible to reduce the interface trap density. Moreover, it was confirmed that the post-nitridation effectively reduced the interface trap density also when the Ge ratio was 0.38.

EXAMPLE 5

Figure 48:
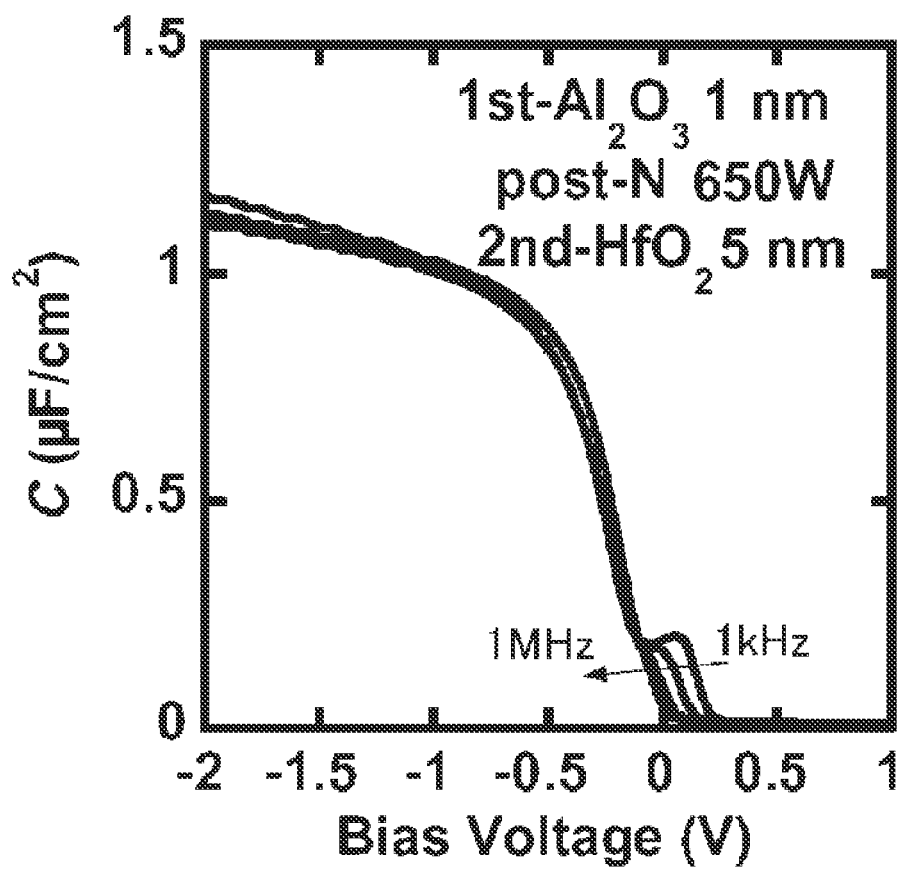
FIG. 48 is a graph of CV characteristics of a MOS structure when hafnium dioxide is used as a second insulating layer.
Figure 49:
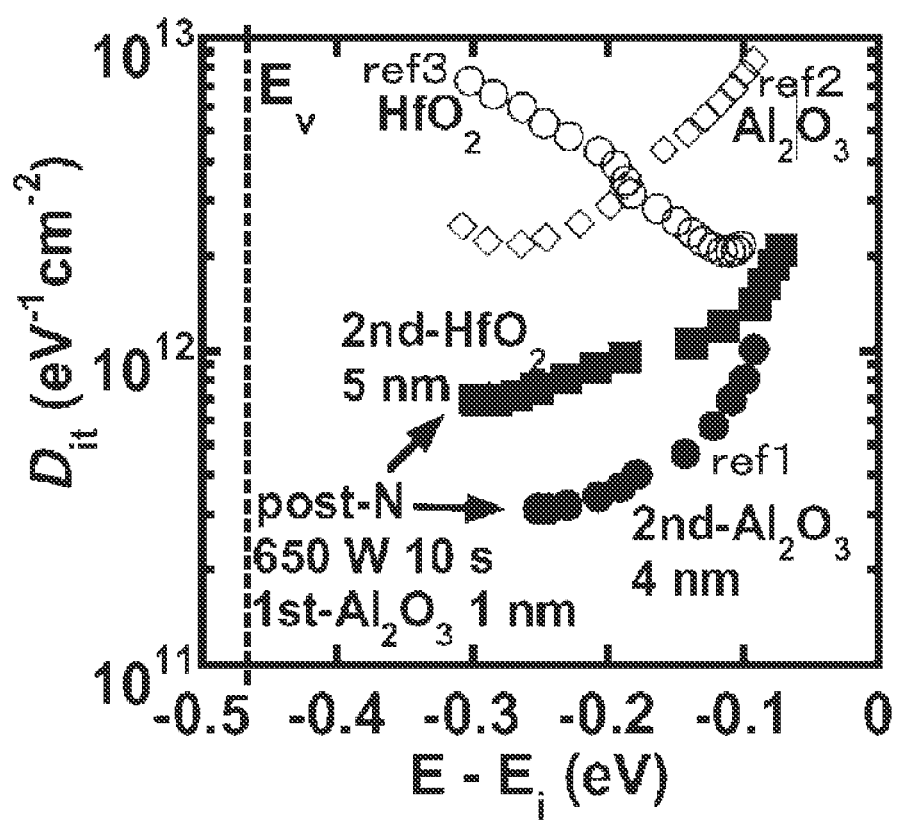
FIG. 49 is a graph showing distributions of the interface trap densities along an energy axis when hafnium dioxide is used as the second insulating layer.

Semiconductor wafers were fabricated in the same manner as Example 1 except that a $HfO_2$ layer, which is the second insulating layer 110, was formed to have a thickness of 5 nm. MOS structures were obtained using the fabricated semiconductor wafers in the same manner as Example 1. FIG. 48 is a graph showing CV characteristics of the obtained MOS structures, and FIG. 49 is a graph showing distributions of the interface trap densities along an energy axis. In FIG. 49, a case (ref1) where an $Al_2O_3$ layer having a thickness of 4 nm was used as the second insulating layer, a case (ref2) where only an $Al_2O_3$ layer was formed as the insulating layer, and a case (ref3) where only the $HfO_2$ layer was formed as the insulating layer were shown for comparison.

As shown in FIG. 48, the CV characteristics of the MOS structure of Example 5 where the $HfO_2$ layer was used as the second insulating layer 110 was not as good as those of the MOS structure of Example 1 and the like where the $Al_2O_3$ layer was used as the second insulating layer 110, but it still showed a relatively fine characteristics. Moreover, as shown in FIG. 49, in terms of the interface trap density, the MOS structure of Example 5 where the $HfO_2$ layer was used as the second insulating layer 110 was not as good as that of the MOS structure of ref 1 where the $Al_2O_3$ layer was used as the second insulating layer, but it achieved a lower interface trap density compared to those of the MOS structures of ref 2 where only the $Al_2O_3$ layer was formed as the insulating layer and ref 3 where only the $HfO_2$ layer was formed as the insulating layer.

In the description herein, a first element such as a layer, region or wafer is referred to as being "on" a second element, the first element may be directly on the second element or the first element may be indirectly on the second element with other element intervening therebetween. In a like fashion, "the first element is formed on the second element" may refer to the case where the first element is directly formed on the second element or the case where the first element is indirectly formed on the second element. The terms referring to a direction "over," "under," and the like are used for describing relative directions in a semiconductor wafer and a semiconductor device and not necessarily for describing permanent positions with respect to the reference plane such as the ground.

DESCRIPTION OF REFERENCE NUMERALS

100: semiconductor wafer, 102: supporting wafer, 103: original semiconductor crystal layer, 104: semiconductor crystal layer, 106: first insulating layer, 108: interlayer, 110: second insulating layer, 112: insulating layer, 114: electrically-conductive layer, 116: source-drain, 200: semiconductor device.

The invention claimed is:

1. A semiconductor wafer comprising:
   a semiconductor crystal layer;
   an interlayer; and
   an insulating layer made of an oxide, wherein
   the semiconductor crystal layer, the interlayer, and the insulating layer are arranged in the stated order,
   the interlayer is made of an oxide, nitride, or oxynitride of a semiconductor crystal constituting the semiconductor crystal layer,
   the semiconductor crystal layer is made of $Si_{1-x}Ge_x$ (x<0.25),
   a part of the insulting layer in contact with the interlayer is made of $Al_2O_3$, and
   an interface trap density measured by a conductance method where the semiconductor crystal layer and the insulating layer form a semiconductor-insulator interface in a MOS structure is $1\times10^{12}$ [$eV^{-1}cm^{-2}$] or less.

2. A semiconductor wafer according to claim 1, wherein an increase from an equivalent oxide thickness (EOT) where a surface is not exposed to plasma before the insulating layer is formed or after at least a part of the insulting layer is formed to an EOT where the semiconductor crystal layer and the insulating layer form a semiconductor-insulator interface in the MOS structure is 0.5 nm or less.

3. A semiconductor device comprising:
   the semiconductor wafer according to claim 1; and
   an electrically conductive layer formed on the insulating layer, wherein
   a MOS structure is formed of the semiconductor crystal layer, the insulating layer, and the electrically-conductive layer.

* * * * *